US012674095B2

(12) United States Patent
Jung et al.

(10) Patent No.: US 12,674,095 B2
(45) Date of Patent: Jul. 7, 2026

(54) QUANTUM DOT COMPOSITION, LIGHT-EMITTING DEVICE USING THE QUANTUM DOT COMPOSITION, AND ELECTRONIC APPARATUS INCLUDING THE LIGHT-EMITTING DEVICE

(71) Applicant: Samsung Display Co., Ltd., Yongin-si (KR)

(72) Inventors: Yunku Jung, Yongin-si (KR); Yunhyuk Ko, Yongin-si (KR); Yohan Suh, Yongin-si (KR); Changyeol Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 696 days.

(21) Appl. No.: 18/155,972

(22) Filed: Jan. 18, 2023

(65) Prior Publication Data

US 2023/0227722 A1 Jul. 20, 2023

(30) Foreign Application Priority Data

Jan. 19, 2022 (KR) ........................ 10-2022-0007980

(51) Int. Cl.

| | |
|---|---|
| ***C09K 11/88*** | (2006.01) |
| ***B82Y 20/00*** | (2011.01) |
| ***B82Y 40/00*** | (2011.01) |
| ***C09K 11/02*** | (2006.01) |
| ***C09K 11/08*** | (2006.01) |
| ***H10K 50/115*** | (2023.01) |

(52) U.S. Cl.

CPC .......... *C09K 11/883* (2013.01); *C09K 11/025* (2013.01); *C09K 11/0883* (2013.01); *H10K 50/115* (2023.02); *B82Y 20/00* (2013.01); *B82Y 40/00* (2013.01)

(58) Field of Classification Search

CPC . C09K 11/883; C09K 11/0883; C09K 11/025; H10K 50/115

See application file for complete search history.

(56) References Cited

U.S. PATENT DOCUMENTS

| | | | |
|---|---|---|---|
| 10,446,781 | B2 | 10/2019 | Seo et al. |
| 10,988,685 | B2 | 4/2021 | Ahn et al. |
| 11,005,060 | B2 | 5/2021 | Chung et al. |
| 11,205,761 | B2 | 12/2021 | Kim et al. |
| 11,917,845 | B2 | 2/2024 | Lee et al. |
| 2010/0213438 | A1 | 8/2010 | Cho et al. |
| 2018/0019371 | A1 | 1/2018 | Steckel et al. |
| 2018/0190625 | A1 | 7/2018 | Steckel et al. |

(Continued)

FOREIGN PATENT DOCUMENTS

| | | | |
|---|---|---|---|
| JP | 2019165006 | A | 9/2019 |
| KR | 20180059363 | A | 6/2018 |

(Continued)

*Primary Examiner* — C Melissa Koslow

(74) *Attorney, Agent, or Firm* — CANTOR COLBURN LLP

(57) ABSTRACT

A quantum dot composition, including a first quantum dot and a second quantum dot, wherein a valence band maximum energy level of the first quantum dot is different from a valence band maximum energy level of the second quantum dot, as determined by ambient photoelectron spectroscopy, and an energy band gap of the first quantum dot is identical to an energy band gap of the second quantum dot, as determined by ultraviolet-visible spectroscopy.

20 Claims, 6 Drawing Sheets

(56) References Cited

U.S. PATENT DOCUMENTS

| | | | |
|---|---|---|---|
| 2021/0408418 | A1 | 12/2021 | Park et al. |
| 2022/0123168 | A1 | 4/2022 | Li et al. |

FOREIGN PATENT DOCUMENTS

| | | | |
|---|---|---|---|
| KR | 101945128 | B1 | 1/2019 |
| KR | 20190058043 | A | 5/2019 |
| KR | 20200114862 | A | 10/2020 |
| KR | 102200111 | B1 | 1/2021 |
| KR | 20210149963 | A | 12/2021 |
| WO | 2021226818 | A1 | 11/2021 |

QUANTUM DOT COMPOSITION, LIGHT-EMITTING DEVICE USING THE QUANTUM DOT COMPOSITION, AND ELECTRONIC APPARATUS INCLUDING THE LIGHT-EMITTING DEVICE

CROSS-REFERENCE TO RELATED APPLICATION

This application is based on and claims priority to Korean Patent Application No. 10-2022-0007980, filed on Jan. 19, 2022, in the Korean Intellectual Property Office, and all the benefits accruing therefrom under 35 U.S.C. § 119, the entire content of which is incorporated by reference herein.

BACKGROUND

1. Field

One or more embodiments relate to a quantum dot composition, a light-emitting device using the quantum dot composition, and an electronic apparatus including the light-emitting device.

2. Description of the Related Art

Quantum dots may be used as materials that perform various optical functions (for example, a light conversion function, a light emission function, and the like) in optical members and various electronic apparatuses. Quantum dots, which are nano-sized semiconductor nanocrystals with a quantum confinement effect, may have different energy bandgaps by adjusting the average particle sizes (D50) and compositions of the nanocrystals, and thus may emit light of various emission wavelengths.

Optical members including such quantum dots may have a thin film form, for example, a thin film patterned according to subpixels. Such optical members may be used as a color conversion member of a device including various light sources.

Quantum dots may be used for a variety of purposes in various electronic apparatuses. For example, quantum dots may be used as emitters. For example, quantum dots may be included in an emission layer of a light-emitting device including a pair of electrodes and the emission layer, and may serve as an emitter.

There is a continuing need to implement high-definition optical members and electronic apparatuses, and to the develop quantum dots that emit a blue light having a maximum emission wavelength of 490 nanometers (nm) or less, that have high photoluminescence quantum yield (PLQY), and that do not include cadmium because it is a toxic element.

SUMMARY

One or more embodiments include a quantum dot composition, a light-emitting device having improved luminescence efficiency and lifespan by using the quantum dot composition, and an electronic apparatus including the light-emitting device.

Additional aspects will be set forth in part in the description which follows and, in part, will be apparent from the description, or may be learned by practice of the presented embodiments.

According to an aspect, a quantum dot composition includes a first quantum dot, and a second quantum dot, wherein a valence band maximum energy level of the first quantum dot is different from a valence band maximum energy level of the second quantum dot, wherein the valence band maximum energy level is measured by ambient photoelectron spectroscopy, and an energy band gap of the first quantum dot is identical to an energy band gap of the second quantum dot, wherein the energy band gap is measured by ultraviolet-visible spectroscopy.

According to another aspect, a light-emitting device includes a first electrode, a second electrode facing the first electrode, and an interlayer located between the first electrode and the second electrode, wherein the interlayer includes an emission layer, and wherein the emission layer further includes the quantum dot composition.

According to still another aspect, an electronic apparatus includes the light-emitting device.

BRIEF DESCRIPTION OF THE DRAWINGS

The above and other aspects, features, and advantages of certain exemplary embodiments will be more apparent from the following detailed description taken in conjunction with the accompanying drawings, in which.

DETAILED DESCRIPTION

Figure 1:
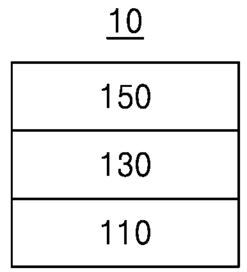
FIG. 1 is a schematic view of a structure of a light-emitting device according to one or more embodiments.

Reference will now be made in further detail to exemplary embodiments, examples of which are illustrated in the accompanying drawings, wherein like reference numerals refer to like elements throughout. In this regard, the present exemplary embodiments may have different forms and should not be construed as being limited to the detailed descriptions set forth herein. Accordingly, the exemplary embodiments are merely described in further detail below, and by referring to the figures, to explain certain aspects of the present detailed description.

As used herein, the term "and/or" includes any and all combinations of one or more of the associated listed items. Expressions such as "at least one of," when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof. As used herein, the singular forms "a," "an," and "the" are intended to include the plural forms as well, unless the context clearly indicates otherwise. The term "or" means "and/or."

The terminology used herein is for the purpose of describing one or more exemplary embodiments only and is not intended to be limiting. Described herein are diverse embodiments, wherein exemplary embodiments are illustrated in the drawings and are described in the detailed description. Effects and features of the detailed description, and methods of achieving the same will be clarified by referring to exemplary embodiments described in further detail and with reference to the drawings. The subject matter may, however, be embodied in many different forms and should not be construed as limited to the exemplary embodiments set forth herein.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

An expression used in the singular encompasses the expression of the plural, unless it has a clearly different meaning in the context.

It will be further understood that the terms such as "including", "having", and "comprising" used herein specify the presence of stated features, regions, integers, steps, operations, elements, and/or components, but do not preclude the presence or addition of one or more other features, regions, integers, steps, operations, elements, and/or components. For example, unless otherwise limited, the terms such as "including", "having", and "comprising" may refer to both the case of consisting of features or components described in the specification and the case of or further including other components.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "Group II" as used herein may include a Group IIA element and a Group IIB element on the IUPAC Periodic Table of Elements, and the Group II element may include, for example, magnesium (Mg), calcium (Ca), zinc (Zn), cadmium (Cd), or mercury (Hg).

The term "Group III" as used herein may include a Group IIIA element and a Group IIIB element on the IUPAC Periodic Table of Elements, and the Group III element may include, for example, aluminum (Al), gallium (Ga), indium (In), or thallium (Tl).

The term "Group V" as used herein may include a Group VA element and a Group VB element on the IUPAC Periodic Table of Elements, and the Group V element may include, for example, nitrogen (N), phosphorus (P), arsenic (As), or antimony (Sb).

The term "Group VI" as used herein may include a Group VIA element and a Group VIB element on the IUPAC Periodic Table of Elements, and the Group VI element may include, for example, sulfur (S), selenium (Se), or tellurium (Te).

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 eV" of the vacuum level, while when the work function or the HOMO energy level is referred to be "shallow," "low," or "small," the work function or HOMO energy level has a small absolute value based on "0 eV" of the vacuum level.

Quantum Dot Composition

A quantum dot composition includes a first quantum dot and a second quantum dot, wherein a valence band maximum (VBM) energy level of the first quantum dot may be different from a VBM energy level of the second quantum dot, and an energy band gap of the first quantum dot may be identical to an energy band gap of the second quantum dot. The VBM energy level is measured by ambient photoelectron spectroscopy (APS). The energy band gap was measured by ultraviolet-visible (UV-Vis) spectroscopy measurement.

In one or more embodiments, the VBM energy level of the first quantum dot may be in a range of about −6.5 electron Volts (eV) to about −5 eV, about −6 eV to about −5 eV, about −5.9 eV to about −5.1 eV, about −5.85 eV to about −5.2 eV, about −5.8 eV to about −5.3 eV, or about −5.75 eV to about −5.4 eV.

In one or more embodiments, the VBM energy level of the second quantum dot may be in a range of about −6.5 eV to about −5 eV, about −6 eV to about −5 eV, about −5.95 eV to about −5.1 eV, about −5.9 eV to about −5.2 eV, about −5.9 eV to about −5.3 eV, or about −5.9 eV to about −5.5 eV.

In one or more embodiments, a difference between the VBM energy level of the first quantum dot and the VBM energy level of the second quantum dot may be in a range of about 0.01 eV to about 1 eV, about 0.01 eV to about 0.7 eV, about 0.05 eV to about 0.5 eV, or about 0.1 eV to about 0.3 eV.

In one or more embodiments, the energy band gaps of the first quantum dot and the second quantum dot may each be in a range of about 1 eV to about 5 eV, about 1.5 eV to about 4 eV, or about 2 eV to about 3 eV.

In one or more embodiments, the first quantum dot may include a core and a shell covering a portion of the core of the first quantum dot, the second quantum dot may include a core and a shell covering a portion of the core of the second quantum dot, and an average particle size (D50) of the core of the first quantum dot may be different from an average particle size (D50) of the core of the second quantum dot.

In one or more embodiments, the core of the first quantum dot and the core of the second quantum dot may each include In or Zn.

In one or more embodiments, the core of the first quantum dot and the core of the second quantum dot may each include InGaP, an amount of Ga in the core of the first quantum dot may be greater than an amount of Ga in the core of the second quantum dot, and the average particle size (D50) of the core of the first quantum dot may be greater than the average particle size (D50) of the core of the second quantum dot.

In one or more embodiments, the core of the first quantum dot and the core of the second quantum dot may each include ZnSeTe, an amount of Te in the core of the first quantum dot may be greater than an amount of Te in the core of the second quantum dot, and the average particle size (D50) of the core of the first quantum dot may be less than the average particle size (D50) of the core of the second quantum dot.

In one or more embodiments, the shell of the first quantum dot may include two or more layers, and the shell of the second quantum dot may include two or more layers. For example, the shell of the first quantum dot may include two or more layers, and the shell of the second quantum dot may each independently include two layers.

In one or more embodiments, the shell of the first quantum dot and the shell of the second quantum dot may each independently include CdS, CdSe, CdTe, ZnS, ZnSe, ZnTe, ZnO, ZnSeS, ZnTeS, GaAs, GaP, GaN, GaO, GaSb, HgS, HgSe, HgTe, InAs, InP, InS, InZnP, InZnS, InGaP, InGaN, InSb, AlAs, AlP, AlSb, PbS, TiO, SrSe, or a combination thereof. For example, the shells may each independently include ZnS, ZnSe, ZnSeS, or a combination thereof.

In one or more embodiments, the first quantum dot may include a first nanomaterial and a first ligand disposed on a surface of the first nanomaterial, the second quantum dot may include a second nanomaterial and a second ligand disposed on a surface of the second nanomaterial, and the first ligand and the second ligand may each independently include a halide, a thiol-containing compound, a carboxylic acid-containing compound, or a combination thereof.

In one or more embodiments, the first nanomaterial and the second nanomaterial may be identical to (the same as) each other.

In one or more embodiments, the first nanomaterial and the second nanomaterial may each independently include a Group II-VI semiconductor compound, a Group III-V semiconductor compound, a Group III-VI semiconductor compound, a Group semiconductor compound, a Group IV-VI semiconductor compound, a Group IV element or compound, or a combination thereof.

In one or more embodiments, the first nanomaterial may include a core and a shell covering a portion of the core of the first nanomaterial, and the second nanomaterial may include a core and a shell covering a portion of the core of the second nanomaterial. For example, the shell of the first nanomaterial and/or the shell of the second nanomaterial may include two or more layers.

In one or more embodiments, the core of the first nanomaterial and the core of the second nanomaterial may each independently include CdS, CdSe, CdTe, ZnS, ZnSe, ZnTe, ZnO, HgS, HgSe, HgTe, MgSe, MgS, GaN, GaP, GaAs, GaSb, AlN, AlP, AlAs, AlSb, InN, InP, InAs, InSb; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb; CdZnSeS, CdZnSeTe, CdZnSTe, CdHgSeS, CdHgSeTe, CdHgSTe, HgZnSeS, HgZnSeTe, HgZnSTe, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

In one or more embodiments, the shell of the first nanomaterial and the shell of the second nanomaterial may each independently include ZnS, ZnSe, ZnTe, ZnO, ZnSeS, ZnTeS, GaAs, GaP, GaN, GaO, GaSb, HgS, HgSe, HgTe, InAs, InP, InS, InGaP, InSb, InZnP, InZnS, InGaP, InGaN, AlAs, AlP, AlSb, PbS, TiO, SrSe, or a combination thereof.

In one or more embodiments, the first ligand and the second ligand may be identical to each other, and an amount of the first ligand in the first quantum dot may be different from an amount of the second ligand in the second quantum dot. For example, the amount of the first ligand in the first quantum dot may be greater than the amount of the second ligand in the second quantum dot by about 1% or greater based on an element ratio.

In one or more embodiments, the first ligand and the second ligand may be different from each other.

In one or more embodiments, the thiol-containing compound may include a $C_1$-$C_{60}$ alkyl group unsubstituted or substituted with at least one $R_{10a}$, a $C_6$-$C_{60}$ aryl group unsubstituted or substituted with at least one $R_{10a}$, —N($Q_1$)($Q_2$), or a combination thereof. $R_{10a}$, $Q_1$, and $Q_2$ are respectively as those described herein.

For example, the thiol-containing compound may include a methyl group, an ethyl group, a $C_3$-$C_{12}$ alkyl group, a phenyl group, a naphthyl group, —$NH_2$, or a combination thereof.

In one or more embodiments, the carboxylic acid-containing compound may include —F, a $C_1$-$C_{60}$ alkyl group unsubstituted or substituted with at least one $R_{10a}$, a $C_1$-$C_{60}$ alkenyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_6$-$C_{60}$ aryl group unsubstituted or substituted with at least one $R_{10a}$, —$N(Q_1)(Q_2)$, or a combination thereof. $R_{10a}$, $Q_1$, and $Q_2$ are respectively as those described herein.

For example, the carboxylic acid-containing compound may include —F, a methyl group, an ethyl group, ethylene, (meth)acrylic acid, —$OCH_3$, a phenyl group, a naphthyl group, —$N(CH_3)_2$, or a combination thereof.

In one or more embodiments, the first ligand and the second ligand may each independently include —F, —Cl, —I, —$SF_5$, oleic acid, 1-dodecanethiol, 2-ethylhexylthiol, cinnamic acid, 4-methoxycinnamic acid, 4-(dimethylamino) cinnamic acid), benzoic acid, 4-methylbenzoic acid, benzenethiol, 4-methylbenzenethiol, 2,6-difluorocinnamic acid, 3,5-difluorocinnamic acid, 4-(trifluoromethyl)cinnamic acid, 4-aminobenzenethiol, or a combination thereof.

In one or more embodiments, a weight ratio of the first quantum dot to the second quantum dot may be in a range of about 1:10 to about 10:1, about 2:8 to about 8:2, or about 3:7 to about 7:3.

Light-Emitting Device 10

Hereinafter, a structure of the light-emitting device 10 according to one or more embodiments and a method of manufacturing the light-emitting device 10 will be described in further detail and in connection with FIG. 1.

FIG. 1 is a schematic cross-sectional view of a light-emitting device 10 according to one or more embodiments. The light-emitting device 10 may include a first electrode 110, an interlayer 130, and a second electrode 150.

First Electrode 110

In FIG. 1, a substrate may be additionally disposed under the first electrode 110 or on the second electrode 150. As the substrate, a glass substrate or a plastic substrate may be used. In one or more embodiments, the substrate may be a flexible substrate, and may include plastics with excellent heat resistance and durability, such as a polyimide, polyethylene terephthalate (PET), a polycarbonate, polyethylene naphthalate, a polyarylate (PAR), a polyetherimide, or a combination thereof.

The first electrode 110 may be formed by, for example, depositing or sputtering a material for forming the first electrode 110 on the substrate. When the first electrode 110 is an anode, the material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, the material for forming the first electrode 110 may include indium tin oxide (ITO), indium zinc oxide (IZO), tin oxide ($SnO_2$), zinc oxide (ZnO), or a combination thereof. In one or more embodiments, when the first electrode 110 is a semi-transmissive electrode or a reflective electrode, the material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or a combination thereof.

The first electrode 110 may have a single-layered structure consisting of a single layer or a multi-layered structure including a plurality of layers. For example, the first electrode 110 may have a three-layered structure of ITO/Ag/ITO.

Interlayer 130

The interlayer 130 may be disposed on the first electrode 110. The interlayer 130 may include an emission layer.

The interlayer 130 may further include a hole transport region located between the first electrode 110 and the emission layer, and an electron transport region located between the emission layer and the second electrode 150.

The interlayer 130 may further include, in addition to various organic materials, a metal-containing compound, such as an organometallic compound, an inorganic material, such as a quantum dot, or the like.

In one or more embodiments, the interlayer 130 may include, i) two or more emitting units sequentially stacked between the first electrode 110 and the second electrode 150, and ii) a charge generation layer located between the two or more emitting units. When the interlayer 130 includes the emitting units and the charge generation layer as described above, the light-emitting device 10 may be a tandem light-emitting device.

Hole Transport Region in Interlayer 130

The hole transport region may have i) a single-layered structure including or consisting of a single layer consisting of a single material, ii) a single-layered structure including or consisting of a single layer consisting of a plurality of different materials, or iii) a multi-layered structure including or consisting of a plurality of layers including different materials.

The hole transport region may include a hole injection layer, a hole transport layer, an emission auxiliary layer, an electron blocking layer, or a combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the layers of each structure being stacked sequentially from the first electrode 110 in the stated orders.

The hole transport region may include a compound represented by Formula 201, a compound represented by Formula 202, or a combination thereof:

Formula 201

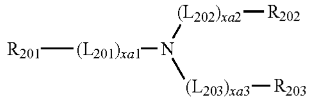

Formula 202

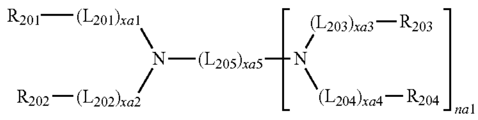

wherein, in Formulae 201 and 202, $L_{201}$ to $L_{204}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $L_{205}$ may be *—O—*', *—S—*', *—$N(Q_{201})$-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (for example, a carbazole group, or the like) unsubstituted or substituted with at least one $R_{10a}$ (for example, see Compound HT16, or the like), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

For example, each of Formulae 201 and 202 may include at least one of the groups represented by Formulae CY201 to CY217:

CY201

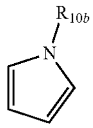

CY202

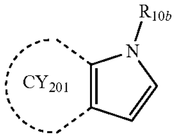

CY203

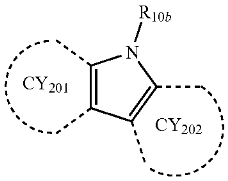

CY204

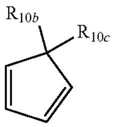

CY205

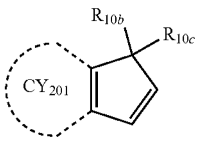

-continued

CY206

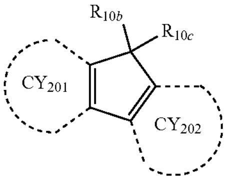

CY207

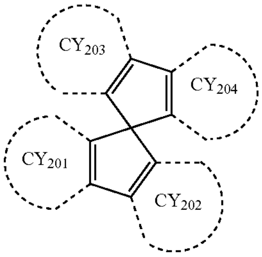

CY208

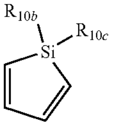

CY209

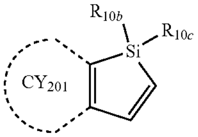

CY210

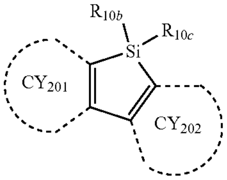

CY211

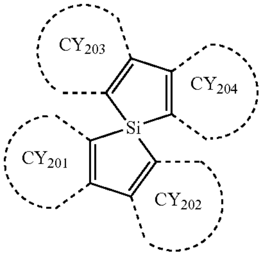

CY212

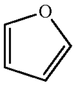

CY213

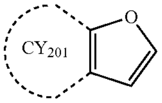

CY214

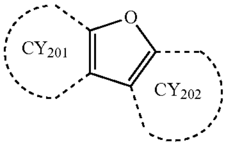

-continued

CY215

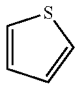

CY216

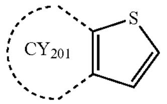

CY217

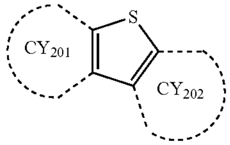

wherein, in Formulae CY201 to CY217, $R_{10b}$ and $R_{10c}$ are each as described in connection with $R_{10a}$, ring $CY_{201}$ to ring $CY_{204}$ may each independently be a $C_3$-$C_{60}$ carbocyclic group or a $C_1$-$C_{60}$ heterocyclic group, and at least one hydrogen in Formulae CY201 to CY217 may be unsubstituted or substituted with $R_{10a}$ as described herein.

In one or more embodiments, ring CY201 to ring CY204 in Formulae CY201 to CY217 may each independently be a phenyl group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one of the groups represented by Formulae CY204 to CY217.

In one or more embodiments, each of Formulae 201 and 202 may not include a group represented by one of Formulae CY201 to CY217.

For example, the hole transport region may include one of Compounds HT1 to HT46, 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(1-naphthyl)-N,N'-diphenylbenzidine (NPB or NPD), β-NPB, N,N'-bis(3-methylphenyl)-N,N'-diphenyl-[1,1-biphenyl]-4,4'-diamine (TPD), spiro-TPD, spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or a combination thereof:

HT1

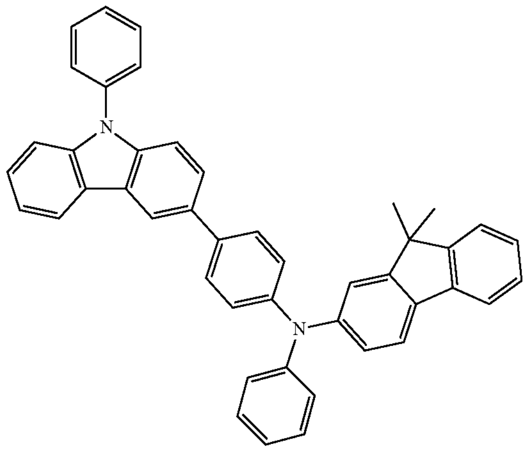

HT2

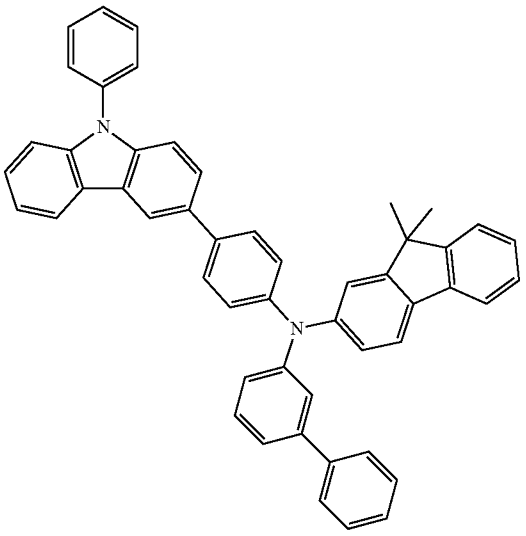

-continued
HT3
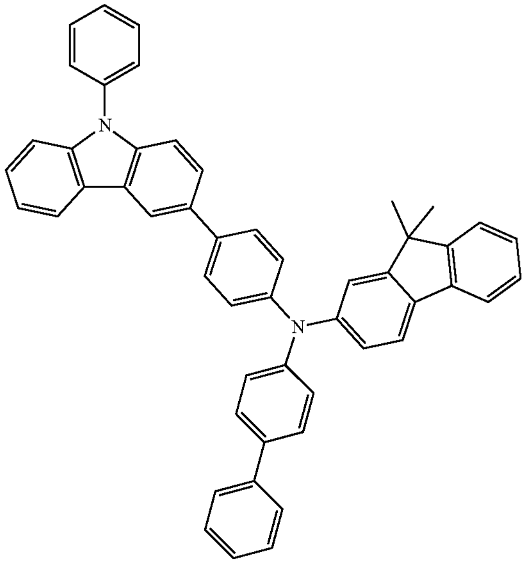
HT4
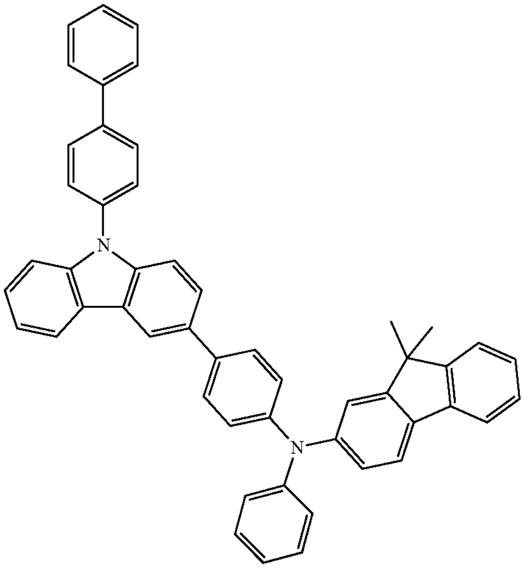
HT5
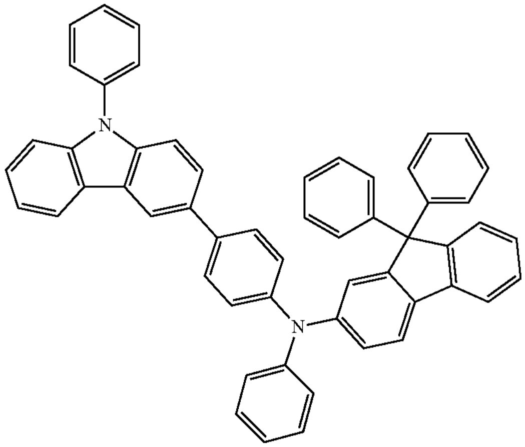
HT6
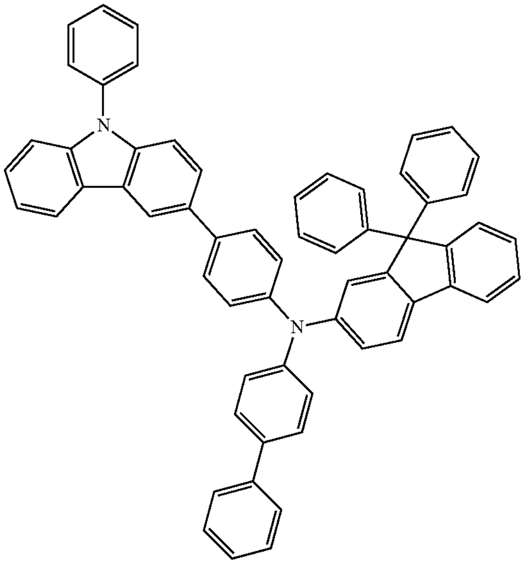

-continued
HT7
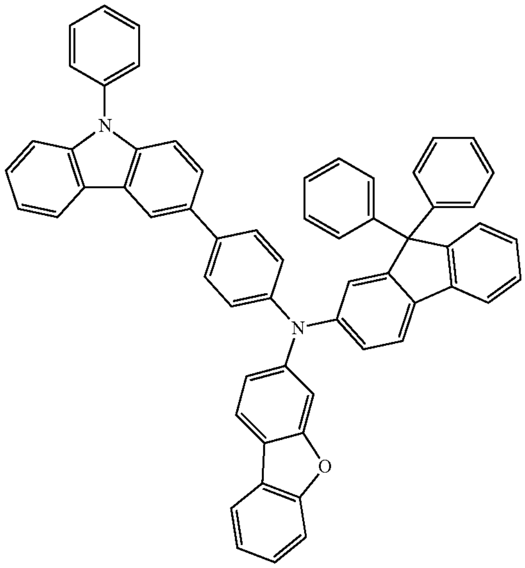
HT8
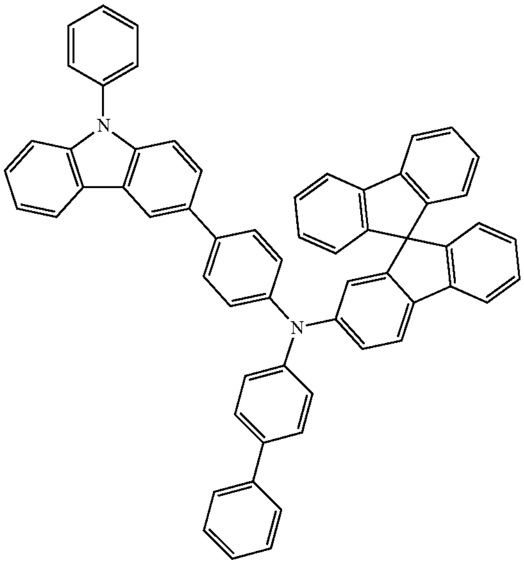
HT9
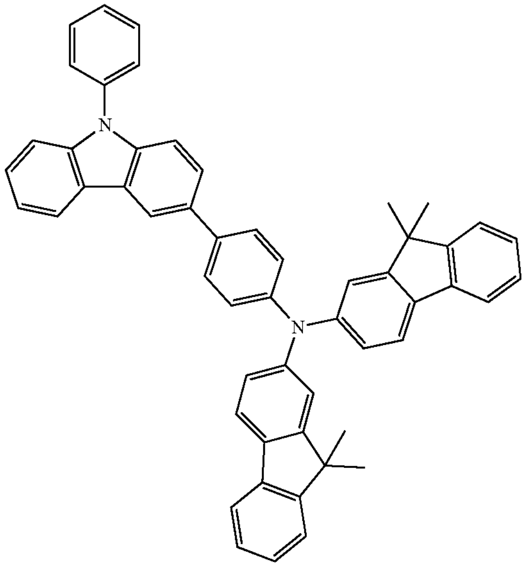
HT10
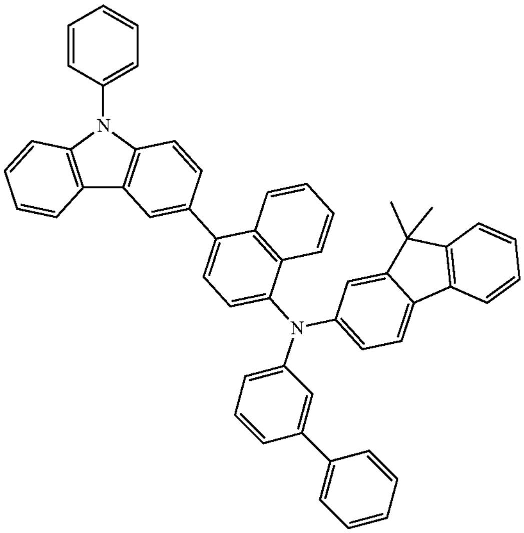

-continued
HT11
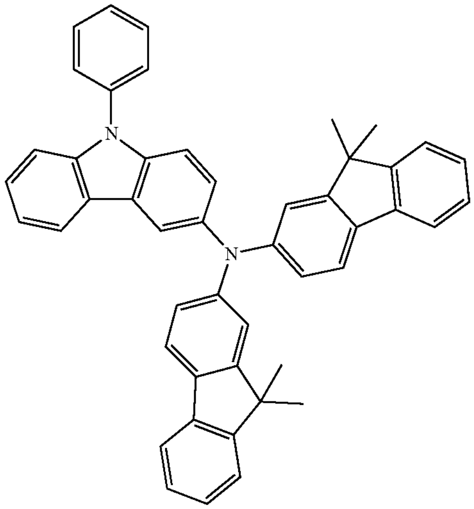
HT12
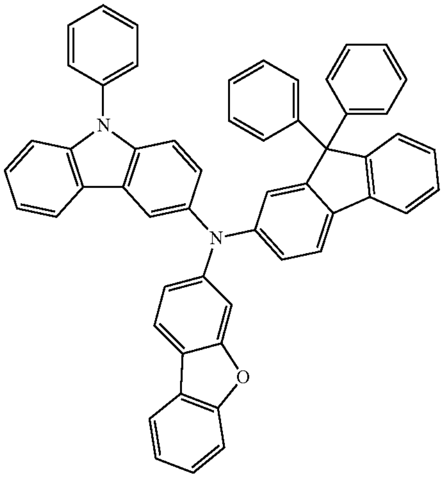
HT13
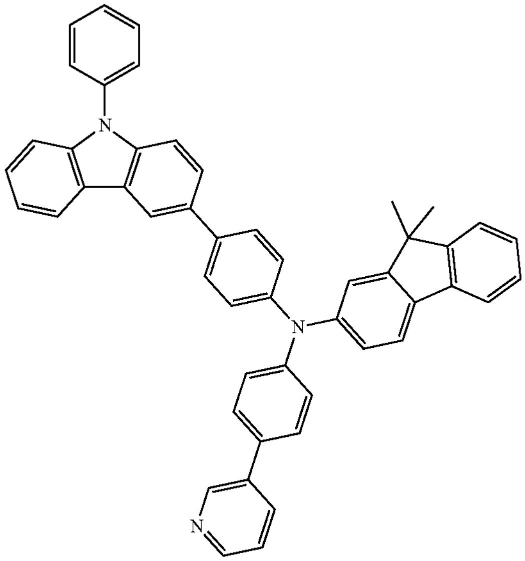
HT14
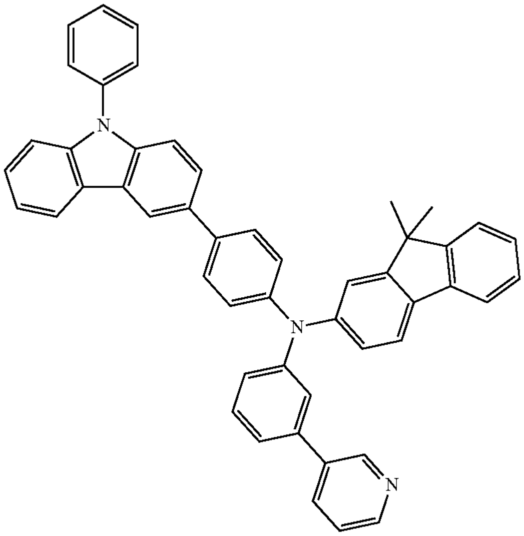
HT15
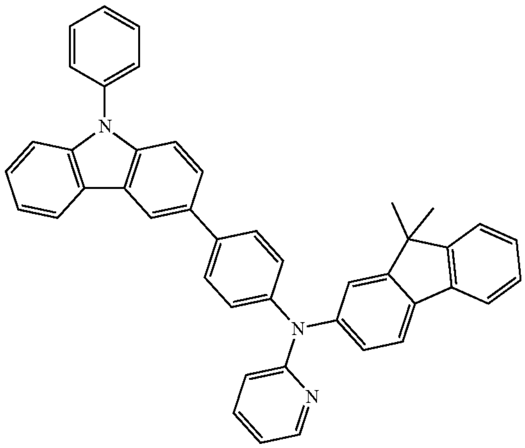
HT16
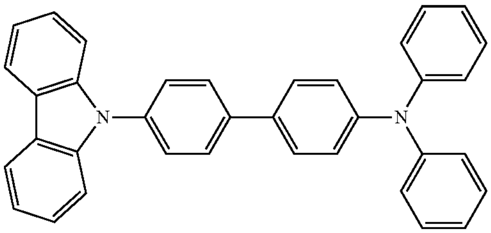

-continued
HT17
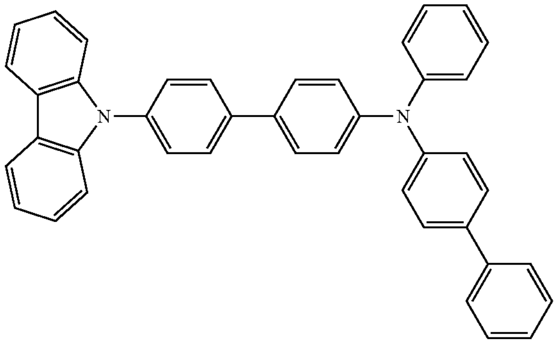
HT18
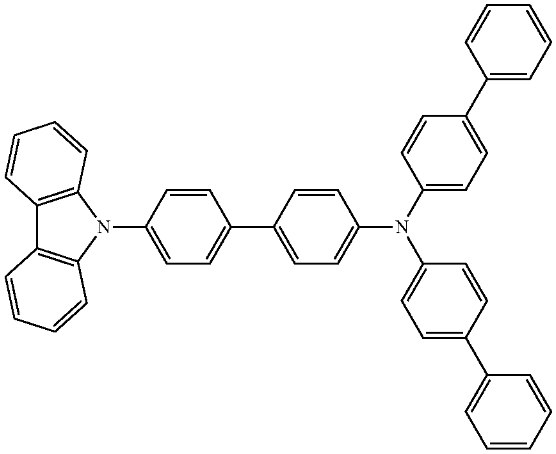
HT19
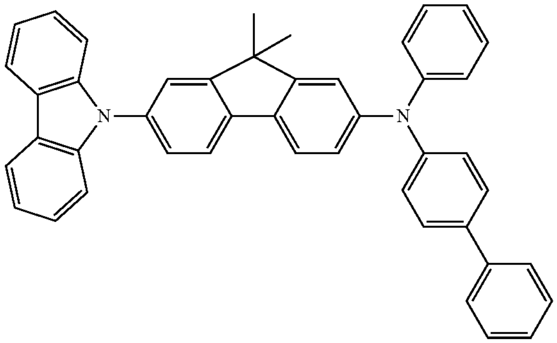
HT20
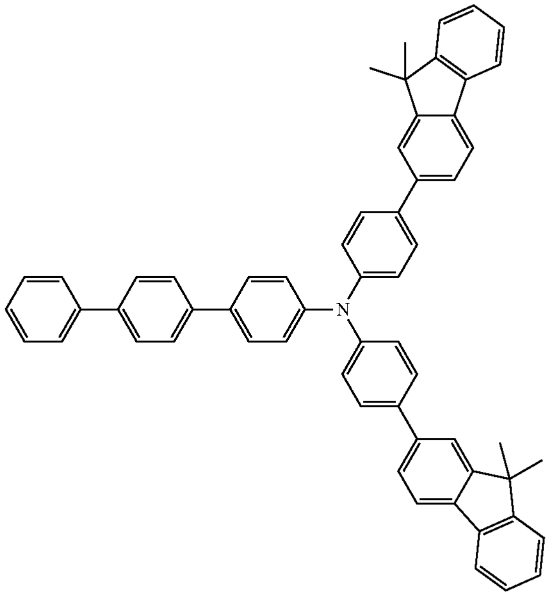
HT21
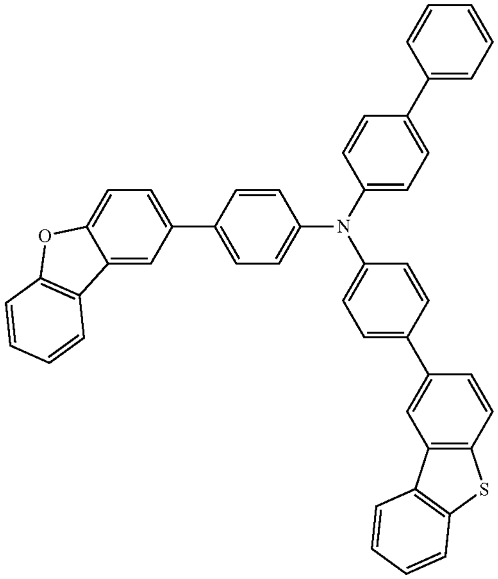
HT22
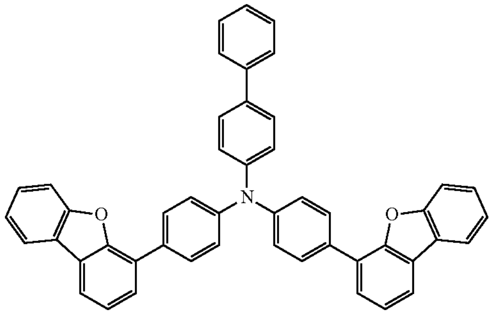

-continued
HT23
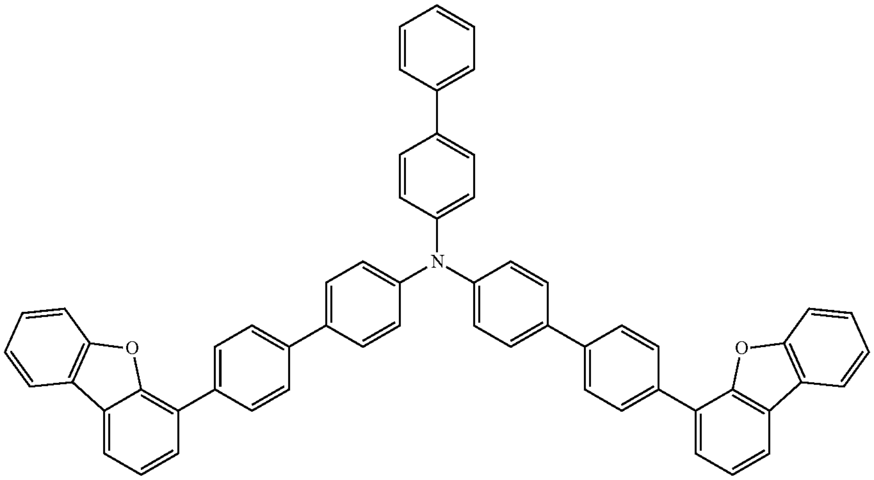
HT24
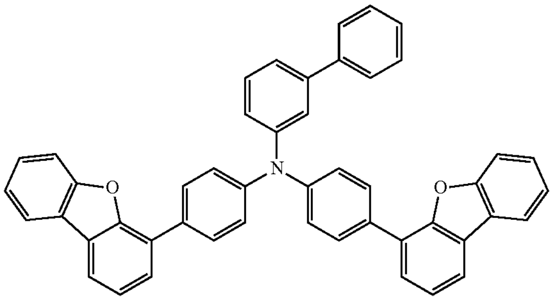
HT25
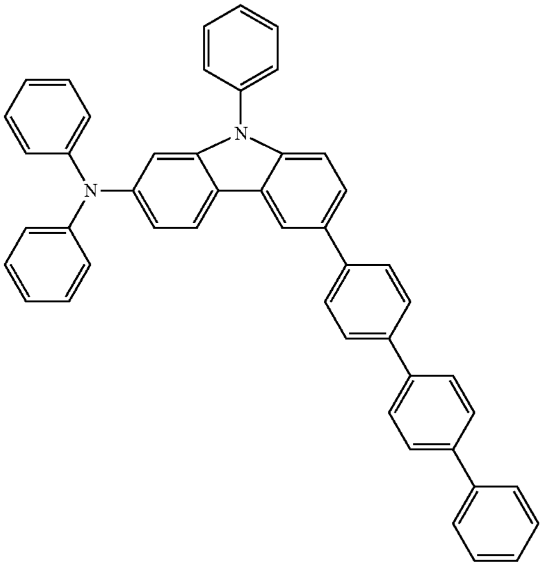
HT26
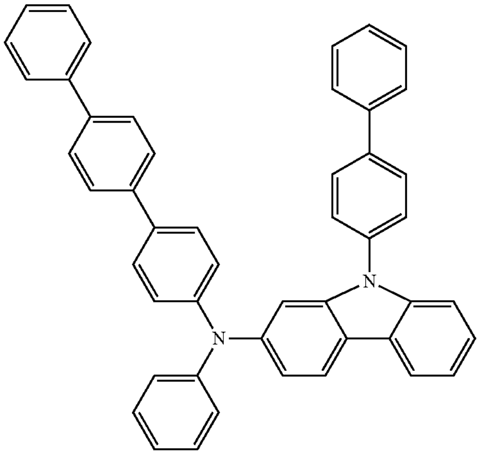
HT27
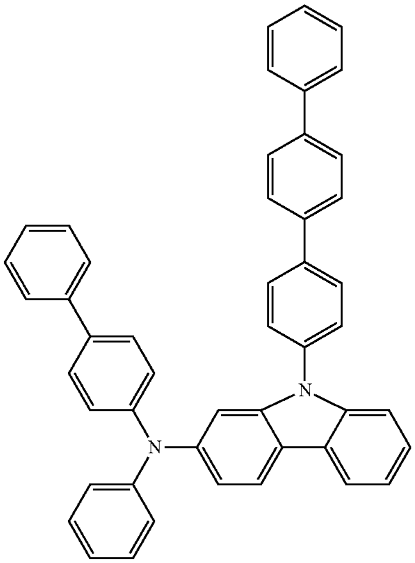

-continued
HT28
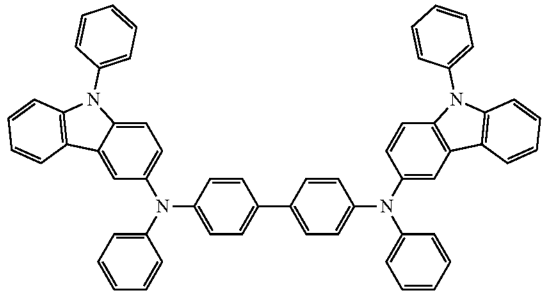
HT29
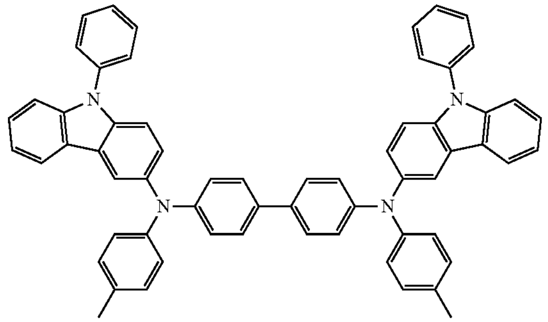
HT30
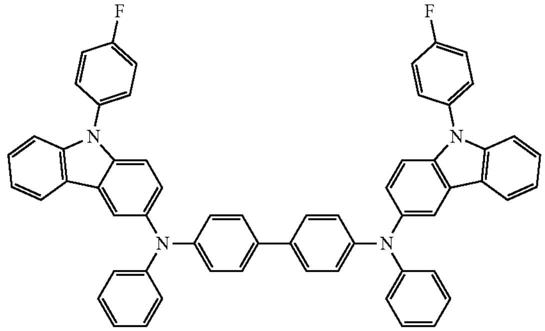
HT31
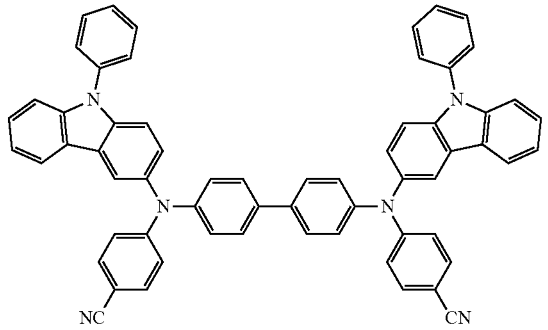
HT32
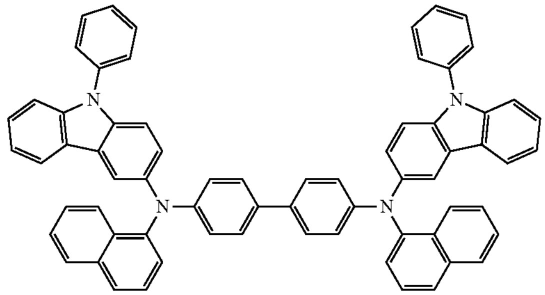
HT33
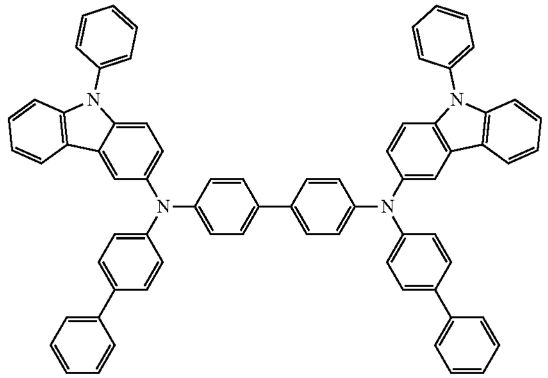
HT34
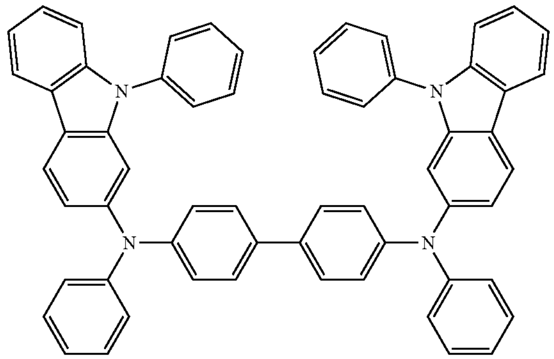
HT35
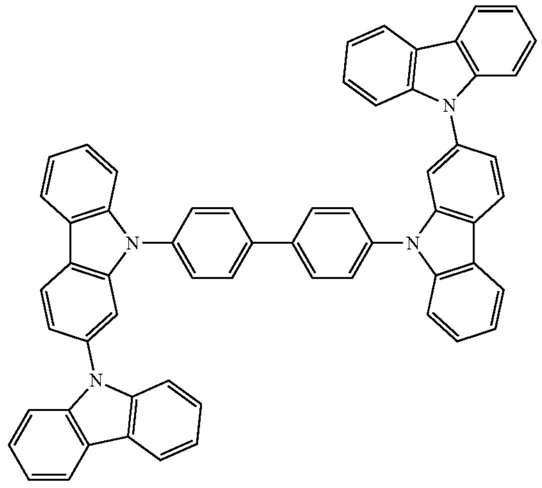

-continued
HT36
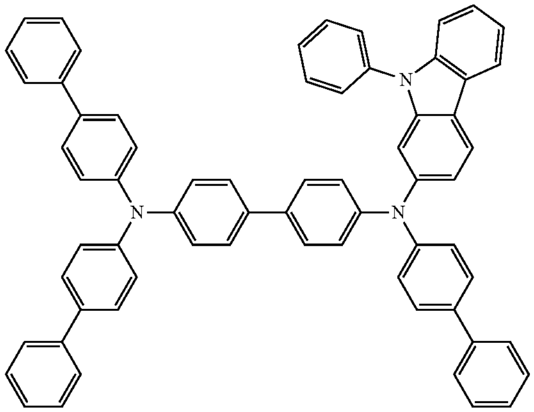
HT37
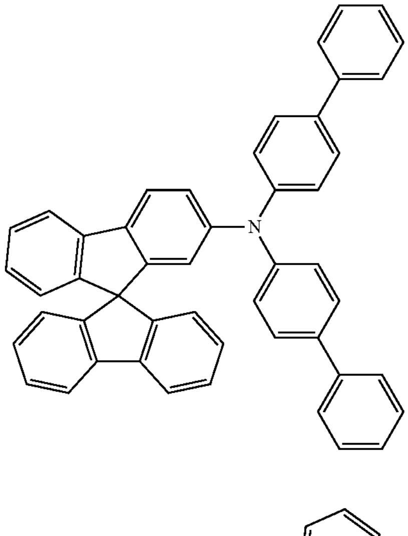
HT38
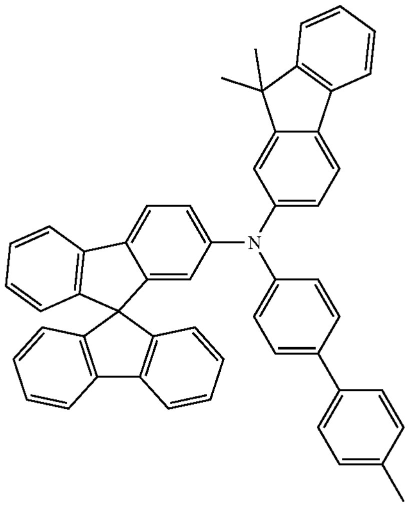
HT39
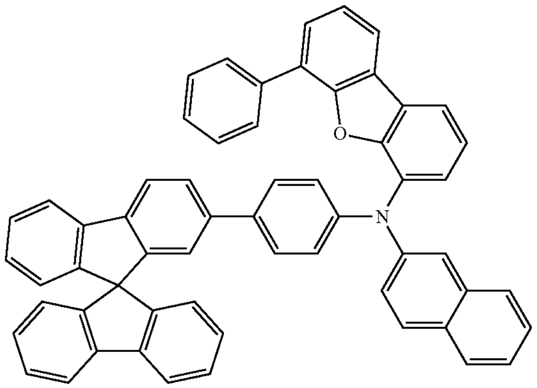
HT40
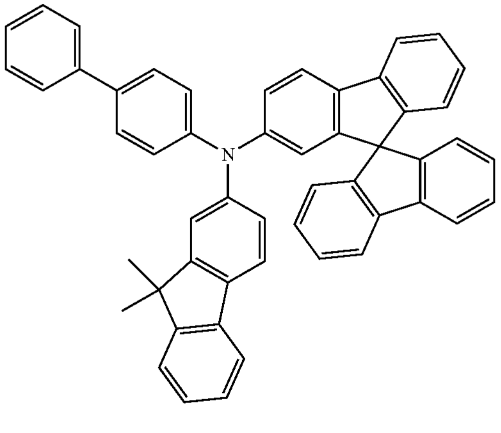
HT41
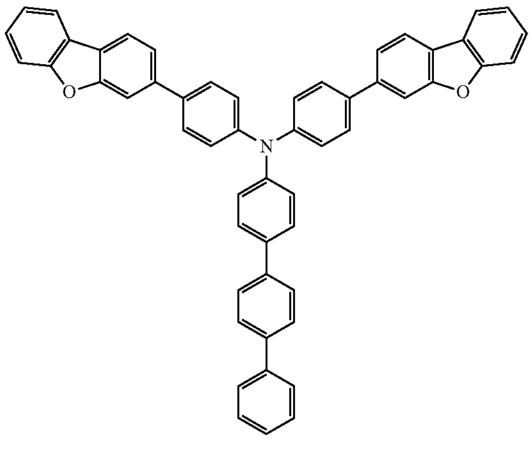

-continued
HT42
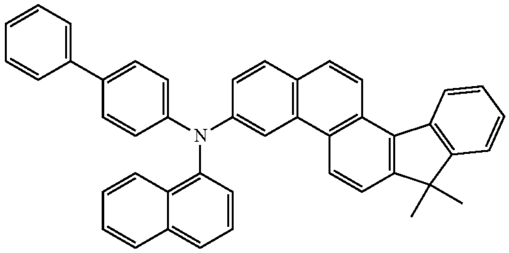
HT43
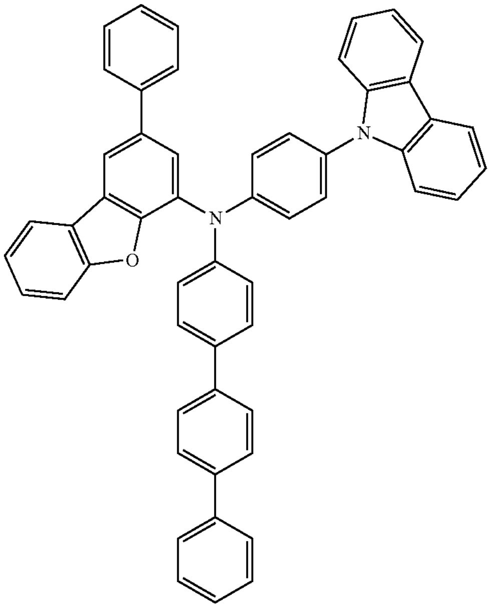
HT44
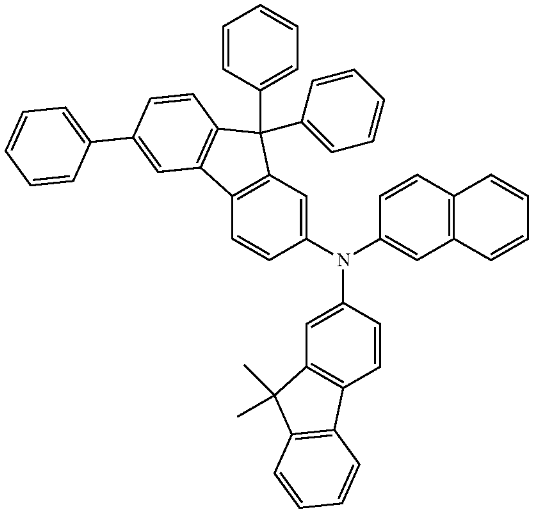
HT45
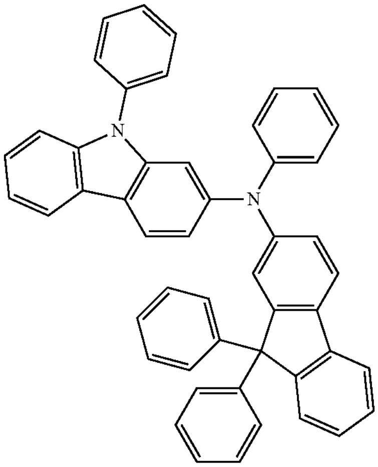
HT46
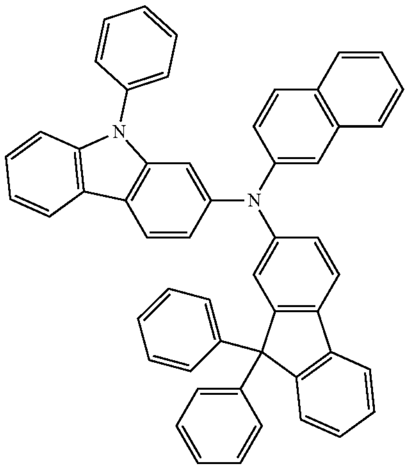

-continued
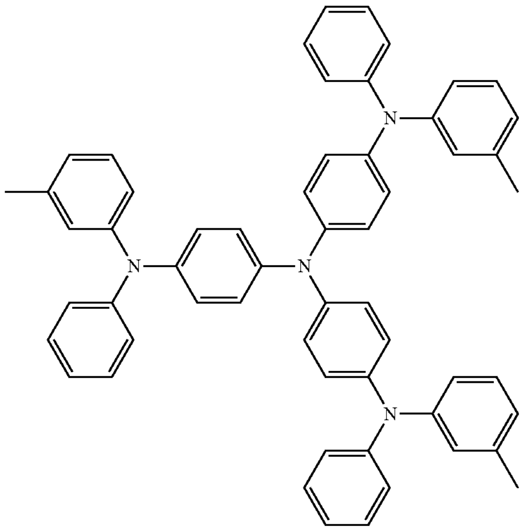
m-MTDATA
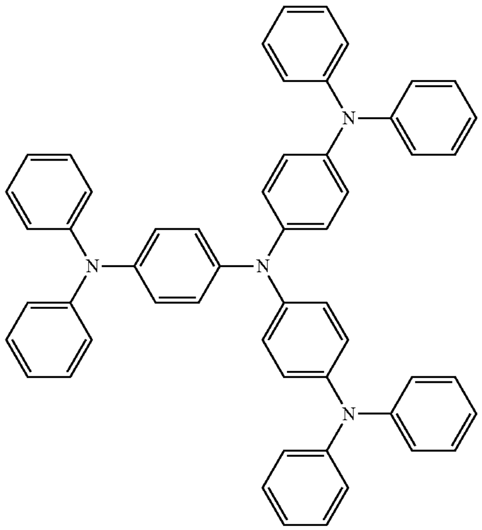
TDATA
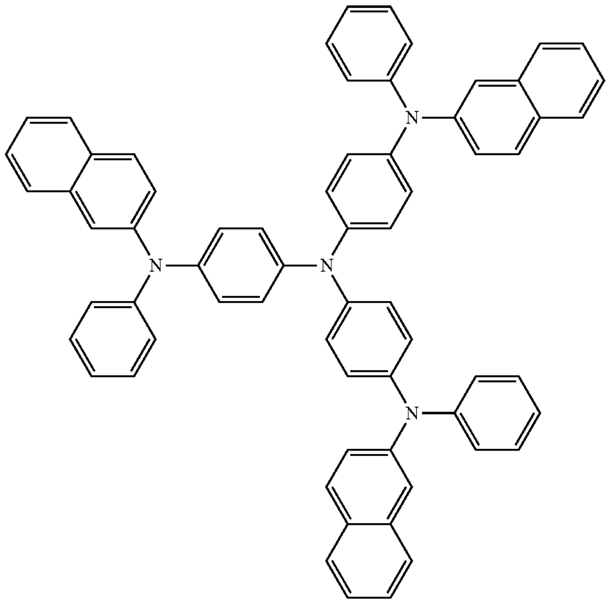
2-TNATA
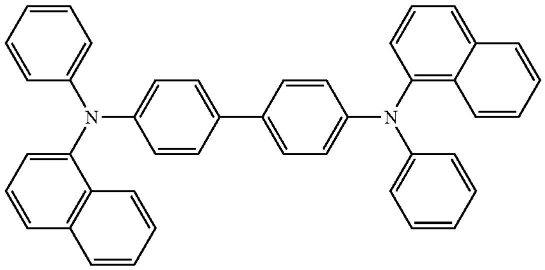
NPB -continued
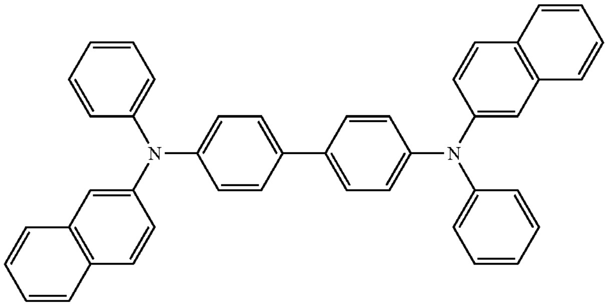
β-NPB
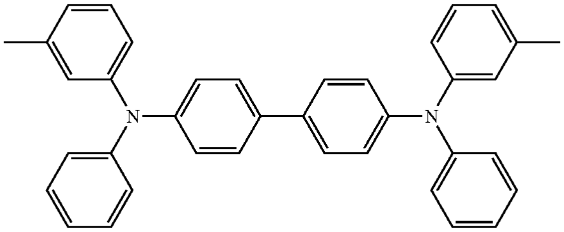
TPD
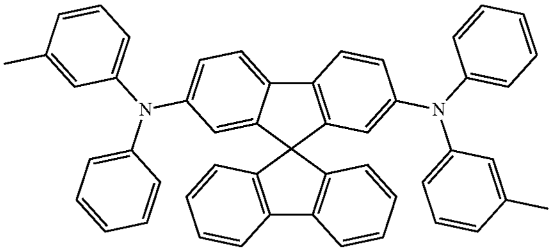
Spiro-TPD
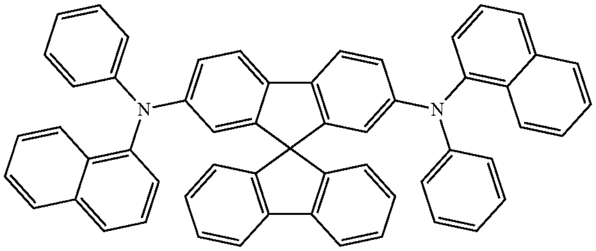
Spiro-NPB
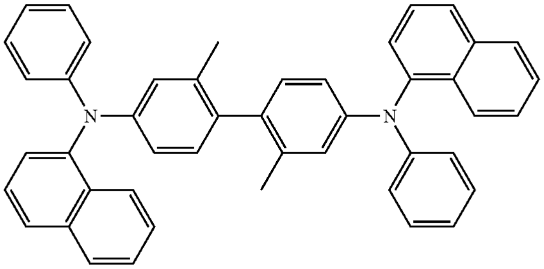
methylated-NPB
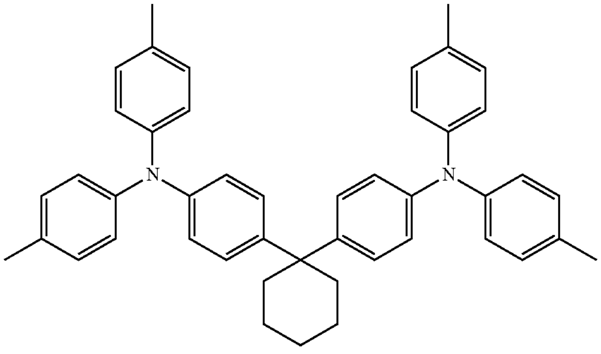
TAPC
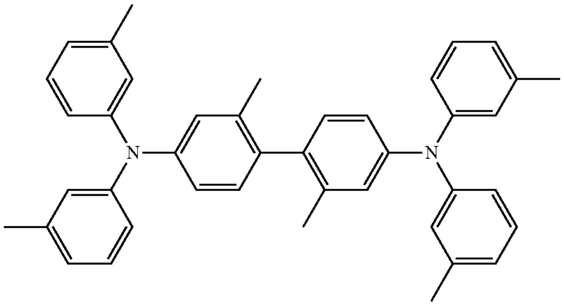
HMTPD A thickness of the hole transport region may be in a range of about 50 angstroms (Å) to about 10,000 Å, for example, about 100 Å to about 4,000 Å. When the hole transport region includes a hole injection layer, a hole transport layer, or a combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block the leakage of electrons from the emission layer to the hole transport region. Materials that may be included in the hole transport region may be included in the emission auxiliary layer and the electron blocking layer.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, a lowest unoccupied molecular orbital (LUMO) energy level of the p-dopant may be −3.5 eV or less.

In one or more embodiments, the p-dopant may include a quinone derivative, a cyano group-containing compound, a compound containing element EL1 and element EL2, or a combination thereof.

Examples of the quinone derivative may include tetracyanoquinodimethane (TCNQ), 2,3,5,6-tetrafluoro-7,7,8,8-tetracyanoquinodimethane (F4-TCNQ), or the like.

Examples of the cyano group-containing compound may include 1,4,5,8,9,12-hexaazatriphenylene-hexacarbonitrile (HAT-CN) or a compound represented by Formula 221:

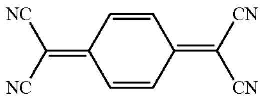

TCNQ

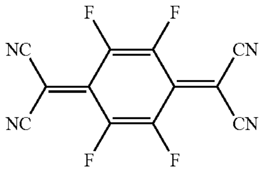

F4-TCNQ

-continued

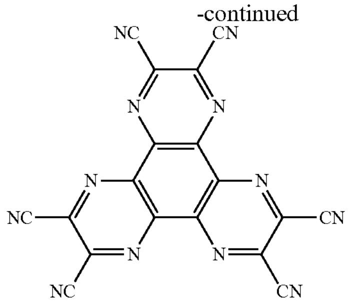

HAT-CN

Formula 221

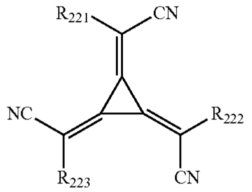

wherein, in Formula 221, $R_{221}$ to $R_{223}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with at least one of a cyano group; —F; —Cl; —Br; —I; —$SF_5$, a $C_1$-$C_{60}$ alkyl group substituted with at least one of a cyano group, —F, —Cl, —Br, —I, —$SF_5$, or a combination thereof; or a combination thereof.

In the compound containing element EL1 and element EL2, element EL1 may be metal, metalloid, or a combination thereof, and element EL2 may be non-metal, metalloid, or a combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), or the like); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like), or a combination thereof.

Examples of the metalloid may include silicon (Si), antimony (Sb), tellurium (Te), or a combination thereof.

Examples of the non-metal may include oxygen (O), halogen (for example, —F, —Cl, —Br, —I), or a combination thereof.

For example, the compound containing element EL1 and element EL2 may include a metal oxide, a metal halide (for example, metal fluoride, metal chloride, metal bromide, metal iodide, or the like), a metalloid halide (for example, a metalloid fluoride, a metalloid chloride, a metalloid bromide, a metalloid iodide, etc.), a metal telluride, or a combination thereof.

Examples of the metal oxide may include a tungsten oxide (for example, WO, $W_2O_3$, $WO_2$, $WO_3$, $W_2O_5$, or the like), a vanadium oxide (for example, VO, $V_2O_3$, $VO_2$, $V_2O_5$, or the like), a molybdenum oxide (MoO, $Mo_2O_3$, $MoO_2$, $MoO_3$, $Mo_2O_5$, or the like), a rhenium oxide (for example, $ReO_3$, or the like), or a combination thereof.

Examples of the metal halide may include an alkali metal halide, an alkaline earth metal halide, a transition metal halide, a post-transition metal halide, a lanthanide metal halide, or a combination thereof.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, or a combination thereof.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, or a combination thereof.

Examples of the transition metal halide may include a titanium halide (for example, $TiF_4$, $TiCl_4$, $TiBr_4$, $TiI_4$, or the like), a zirconium halide (for example, $ZrF_4$, $ZrCl_4$, $ZrBr_4$, $ZrI_4$, or the like), a hafnium halide (for example, $HfF_4$, $HfCl_4$, $HfBr_4$, $HfI_4$, or the like), a vanadium halide (for example, $VF_3$, $VCl_3$, $VBr_3$, $VI_3$, or the like), a niobium halide (for example, $NbF_3$, $NbCl_3$, $NbBr_3$, $NbI_3$, or the like), a tantalum halide (for example, $TaF_3$, $TaCi_3$, $TaBr_3$, $TaI_3$, or the like), a chromium halide (for example, $CrF_3$, $CrCl_3$, $CrBr_3$, $CrI_3$, or the like), a molybdenum halide (for example, $MoF_3$, $MoCl_3$, $MoBr_3$, $MoI_3$, or the like), a tungsten halide (for example, $WF_3$, $WCl_3$, $WBr_3$, $WI_3$, or the like), a manganese halide (for example, $MnF_2$, $MnCl_2$, $MnBr_2$, $MnI_2$, or the like), a technetium halide (for example, $TcF_2$, $TcCl_2$, $TcBr_2$, $TcI_2$, or the like), a rhenium halide (for example, $ReF_2$, $ReCl_2$, $ReBr_2$, $ReI_2$, or the like), an iron halide (for example, $FeF_2$, $FeCl_2$, $FeBr_2$, $FeI_2$, or the like), a ruthenium halide (for example, $RuF_2$, $RuCl_2$, $RuBr_2$, $RuI_2$, or the like), an osmium halide (for example, $OsF_2$, $OSCl_2$, $OsBr_2$, $OsI_2$, or the like), a cobalt halide (for example, $CoF_2$, $CoCl_2$, $CoBr_2$, $CoI_2$, or the like), a rhodium halide (for example, $RhF_2$, $RhCl_2$, $RhBr_2$, $RhI_2$, or the like), an iridium halide (for example, $IrF_2$, $IrCl_2$, $IrBr_2$, $IrI_2$, or the like), a nickel halide (for example, $NiF_2$, $NiCl_2$, $NiBr_2$, $NiI_2$, or the like), a palladium halide (for example, $PdF_2$, $PdCl_2$, $PdBr_2$, $PdI_2$, or the like), a platinum halide (for example, $PtF_2$, $PtCl_2$, $PtBr_2$, $PtI_2$, or the like), a copper halide (for example, CuF, CuCl, CuBr, CuI, or the like), a silver halide (for example, AgF, AgCl, AgBr, AgI, or the like), a gold halide (for example, AuF, AuCl, AuBr, AuI, or the like), or a combination thereof.

Examples of the post-transition metal halide may include a zinc halide (for example, $ZnF_2$, $ZnCl_2$, $ZnBr_2$, $ZnI_{12}$, or the like), an indium halide (for example, $InI_3$, or the like), a tin halide (for example, $SnI_2$, or the like), or a combination thereof.

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, or a combination thereof.

Examples of the metalloid halide may include an antimony halide (for example, $SbCl_5$, or the like).

Examples of the metal telluride may include an alkali metal telluride (for example, $Li_2Te$, $Na_2Te$, $K_2Te$, $Rb_2Te$, $Cs_2Te$, or the like), an alkaline earth metal telluride (for example, BeTe, MgTe, CaTe, SrTe, BaTe, or the like), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, or the like), a post-transition metal telluride (for example, ZnTe, or the like), a lanthanide metal telluride (for example, LaTe, CeTe, PrTe, NdTe, PmTe, EuTe, GdTe, TbTe, DyTe, HoTe, ErTe, TmTe, YbTe, LuTe, or the like), or a combination thereof.

Emission Layer in Interlayer 130

The emission layer may include a quantum dot.

The term "quantum dot" as used herein refers to a crystal of a semiconductor compound, and may include any material capable of emitting light of various emission wavelengths according to the average particle size (D50) of the crystal.

An average particle size (D50) or diameter of the quantum dot may be, for example, in a range of about 1 nm to about 10 nm.

The quantum dot may be synthesized by a wet chemical process, a metal organic chemical vapor deposition process, a molecular beam epitaxy process, or any suitable process similar thereto.

The wet chemical process is a method including mixing a precursor material with an organic solvent and then growing a quantum dot particle crystal. When the crystal grows, the organic solvent naturally acts as a dispersant coordinated on the surface of the quantum dot crystal and controls the growth of the crystal so that the growth of quantum dot particles can be controlled through a process which costs lower, and is easier than vapor deposition methods, such as metal organic chemical vapor deposition (MOCVD) or molecular beam epitaxy (MBE).

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or a combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, MgS, or a combination thereof; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary compound, such as CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof.

Examples of the Group III-V semiconductor compound may include: a binary compound, such as GaN, GaP, GaAs, GaSb, AlN, AlP, AlAs, AlSb, InN, InP, InAs, InSb, or a combination thereof; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or a combination thereof; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. In one or more embodiments, the Group III-V semiconductor compound may further include a Group II element. Examples of the Group III-V semiconductor compound further including the Group II element may include InZnP, InGaZnP, InAlZnP, or a combination thereof.

Examples of the Group III-VI semiconductor compound may include a binary compound, such as GaS, GaSe, $Ga_2Se_3$, GaTe, InS, InSe, $In_2S_3$, $In_2Se_3$, InTe, or a combination thereof; a ternary compound, such as $InGaS_3$, $InGaSe_3$, or a combination thereof; or a combination thereof.

Examples of the Group I-III-VI semiconductor compound may include a ternary compound, such as AgInS, $AgInS_2$, CuInS, $CuInS_2$, $CuGaO_2$, $AgGaO_2$, $AgAlO_2$, or a combination thereof.

Examples of the Group IV-VI semiconductor compound may include a binary compound, such as SnS, SnSe, SnTe, PbS, PbSe, PbTe, or a combination thereof; a ternary compound, such as SnSeS, SnSeTe, SnSTe, PbSeS, PbSeTe, PbSTe, SnPbS, SnPbSe, SnPbTe, or a combination thereof; a quaternary compound, such as SnPbSSe, SnPbSeTe, SnPbSTe, or a combination thereof; or a combination thereof.

The Group IV element or compound may include a single element compound, such as Si or Ge; a binary compound, such as SiC, SiGe, or a combination thereof; or a combination thereof.

Each element included in a multi-element compound, such as the binary compound, the ternary compound, and the quaternary compound, may be present at a uniform concentration (amount) or non-uniform concentration in a particle.

In one or more embodiments, the quantum dot may have a single structure in which the concentration of each element in the quantum dot is uniform, or a core-shell dual structure. For example, a material included in the core and a material included in the shell may be different from each other.

The shell of the quantum dot may act as a protective layer that prevents chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

Examples of the shell of the quantum dot may include an oxide of metal, metalloid, or non-metal, a semiconductor compound, or a combination thereof. Examples of the oxide of metal, metalloid, or non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a combination thereof; a ternary compound, such as $MgAl_2O_4$, $CoFe_2O_4$, $NiFe_2O_4$, $CoMn_2O_4$, or a combination thereof; or a combination thereof. Examples of the semiconductor compound may include, as described herein, a Group II-VI semiconductor compound; a Group III-V semiconductor compound; a Group III-VI semiconductor compound; a Group I-III-VI semiconductor compound; a Group IV-VI semiconductor compound; or a combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof.

A full width at half maximum (FWHM) of an emission wavelength spectrum of the quantum dot may be about 45 nm or less, for example, about 40 nm or less, for example, about 30 nm or less, and within these ranges, color purity or color reproducibility may be improved. In addition, since light through the quantum dot is emitted in all directions, a wide viewing angle may be improved.

In addition, the quantum dot may be in the form of a spherical particle, a pyramidal particle, a multi-arm particle, a cubic nanoparticle, a nanotube particle, a nanowire particle, a nanofiber particle, or a nanoplate particle.

Since the energy band gap may be adjusted by controlling the average particle size of the quantum dot, light having various wavelength bands can be obtained from the quantum dot emission layer. Accordingly, by using quantum dots of different average particle sizes, a light-emitting device that emits light of various wavelengths may be implemented. In particular, the average particle size of the quantum dot may be selected to emit a red light, a green light, and/or a blue light. In addition, the average particle size of the quantum dot may be configured to emit a white light by combination of light of various colors.

In one or more embodiments, the emission layer may include the quantum dot composition as described herein.

The quantum dot composition includes a first quantum dot and a second quantum dot that have an identical energy band gap but different energy band positions (for example, VBM energy levels). Since each quantum dot has an energy band position that is suitable for injection of electrons or holes, when the emission layer is formed using the quantum dot composition including the first quantum dot and the second quantum dot, the injection of charges (electrons or holes) into the emission layer may be improved. Accordingly, a light-emitting device having improved luminescence efficiency and lifespan may be provided.

Figure 2:
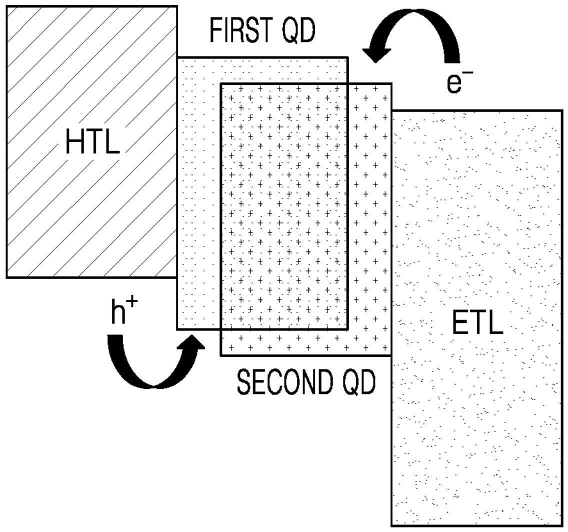
FIG. 2 is a schematic view of a charge injection process of a light-emitting device according to one or more embodiments.

Referring to FIG. 2, it can be seen that when the first quantum dot and the second quantum dot having different energy band positions are used together in the emission layer, the first quantum dot and the second quantum dot may act as steps between a hole transport layer and an electron transport layer and the emission layer, so that injection of charges from the hole transport layer and the electron transport layer to the emission layer may be improved.

The emission layer may be a quantum dot single layer or a structure in which two or more quantum dot layers are stacked. For example, the emission layer may be a quantum dot single layer or a structure in which 2 to 5 quantum dot layers are stacked.

The emission layer may further include a different quantum dot in addition to the quantum dot as described herein.

The emission layer may further include, in addition to the quantum dot as described herein, a dispersion medium wherein the quantum dots may be dispersed in a naturally coordinated form. The dispersion medium may include an organic solvent, a polymer resin, or a combination thereof. The dispersion medium may be any suitable transparent medium that does not substantially affect the optical performance of the quantum dot, is not substantially deteriorated by light, does not substantially reflect light, or does not substantially absorb light. For example, the organic solvent may include toluene, chloroform, ethanol, octane, or a combination thereof, and the polymer resin may include an epoxy resin, a silicone resin, a polystyrene resin, a (meth) acrylate resin, or a combination thereof.

The emission layer may be formed by coating, on the hole transport region, a quantum dot-containing composition for forming the emission layer, and volatilizing a portion or more of the solvent from the composition for forming the emission layer.

For example, as the solvent, water, hexane, chloroform, toluene, octane, or the like, or a combination thereof may be used.

The coating of the composition for forming the emission layer may be performed using a spin coat method, a casting method, a micro gravure coating method, a gravure coating method, a bar coating method, a roll coating method, a wire bar coating method, a dip coating method, a spray coating method, a screen printing method, a flexographic coating method, an offset printing method, an ink jet printing method, or the like, or a combination thereof.

When the light-emitting device 10 is a full-color light-emitting device, the emission layer may include emission layers that emit light of different colors according to individual subpixels.

For example, the emission layer may be patterned into a first color emission layer, a second color emission layer, and a third color emission layer according to individual subpixels. In this regard, at least one emission layer of the emission layers described herein may essentially include the quantum dot. In particular, the first color emission layer may be a quantum dot emission layer including the quantum dot, and the second color emission layer and the third color emission layer each may be organic emission layers including organic compounds, respectively, and not including quantum dots. In this regard, the first color to the third color are different colors, and for example, the first color to the third color may have different maximum emission wavelengths ($\lambda_{max}$). The first color to the third color may be white when combined with each other.

In one or more embodiments, the emission layer may further include a fourth color emission layer, and at least one emission layer of the first color to fourth color emission layers may be a quantum dot emission layer including the quantum dot, and the remaining emission layers each may be organic emission layers including organic compounds, respectively, and not including quantum dots. Other various modifications are possible. In this regard, the first color to the fourth color are different colors, and for example, the first color to the fourth color may have different maximum emission wavelengths. The first color to the fourth color may be white when combined with each other.

In one or more embodiments, the light-emitting device 10 may have a stacked structure wherein two or more emission layers that emit light of identical or different colors contact each other or are separated from each other. At least one emission layer of the two or more emission layers may be a quantum dot emission layer including the quantum dot, and the remaining emission layer may be an organic emission layer including an organic compound and not including a quantum dot. Other various modifications are possible. In particular, the light-emitting device 10 may include a first color emission layer and a second color emission layer, and the first color and the second color may be the same color or different colors. More particularly, the first color and the second color may both be blue.

The emission layer may further include, in addition to the quantum dot, at least one of an organic compound and a semiconductor compound.

In particular, the organic compound may include a host and a dopant. The host and the dopant may include a host and a dopant that are commonly used in organic light-emitting devices, respectively.

In particular, the semiconductor compound may be an organic and/or inorganic perovskite.

Electron Transport Region in Interlayer 130

The electron transport region may have i) a single-layered structure including or consisting of a single layer consisting of a single material, ii) a single-layered structure including or consisting of a single layer consisting of a plurality of different materials, or iii) a multi-layered structure including or consisting of a plurality of layers including different materials.

The electron transport region may include a buffer layer, a hole blocking layer, an electron control layer, an electron transport layer, an electron injection layer, or a combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, the layers of each structure being stacked sequentially from the emission layer in the stated orders.

The electron transport region may include a metal oxide, and a metal of the metal oxide may include Zn, Ti, Zr, Sn, W, Ta, Ni, Mo, Cu, Mg, Co, Mn, Y, Al, or a combination thereof. In addition, the electron transport region may include a metal sulfide, for example, CuSCN or the like.

The electron transport region (for example, the electron injection layer or the electron transport layer in the electron transport region) may include a metal oxide represented by Formula 3:

$$M_pO_q \quad \text{Formula 3}$$

wherein, in Formula 3,

M may be Zn, Ti, Zr, Sn, W, Ta, Ni, Mo, Cu, V, or a combination thereof, and p and q may each independently be an integer from 1 to 5.

The metal oxide may be represented by Formula 3-1:

$$Zn_{(1-r)}M'_rO \quad \text{Formula 3-1}$$

wherein, in Formula 3-1,

M' may be Mg, Co, Ni, Zr, Mn, Sn, Y, Al, or a combination thereof, and r may be a number greater than 0 and equal to or less than 0.5.

In one or more embodiments, the electron transport region may include ZnO or ZnMgO.

For example, the electron transport region may include, ZnO, $TiO_2$, $WO_3$, $SnO_2$, $In_2O_3$, $Nb_2O_5$, $Fe_2O_3$, $CeO_2$, $SrTiO_3$, $Zn_2SnO_4$, $BaSnO_3$, $In_2S_3$, ZnSiO, [6,6]-phenyl-$C_{61}$-butyric acid methyl ester (PC60BM), phenyl-$C_{70}$-butyric acid methyl ester (PC70BM), Mg-doped ZnO (ZnMgO), Al-doped ZnO (AZO), Ga-doped ZnO (GZO), In-doped ZnO (IZO), Al-doped $TiO_2$, Ga-doped $TiO_2$, In-doped $TiO_2$, Al-doped $WO_3$, Ga-doped $WO_3$, In-doped $WO_3$, Al-doped $SnO_2$, Ga-doped $SnO_2$, In-doped $SnO_2$, Mg-doped $In_2O_3$, Al-doped $In_2O_3$, Ga-doped $In_2O_3$, Mg-doped $Nb_2O_5$, Al-doped $Nb_2O_5$, Ga-doped $Nb_2O_5$, Mg-doped $Fe_2O_3$, Al-doped $Fe_2O_3$, Ga-doped $Fe_2O_3$, In-doped $Fe_2O_3$, Mg-doped $CeO_2$, Al-doped $CeO_2$, Ga-doped $CeO_2$, In-doped $CeO_2$, Mg-doped $SrTiO_3$, Al-doped $SrTiO_3$, Ga-doped $SrTiO_3$, In-doped $SrTiO_3$, Mg-doped $Zn_2SnO_4$, Al-doped $Zn_2SnO_4$, Ga-doped $Zn_2SnO_4$, In-doped $Zn_2SnO_4$, Mg-doped $BaSnO_3$, Al-doped $BaSnO_3$, Ga-doped $BaSnO_3$, In-doped $BaSnO_3$, Mg-doped $In_2S_3$, Al-doped $In_2S_3$, Ga-doped $In_2S_3$, In-doped $In_2S_3$, Mg-doped ZnSiO, Al-doped ZnSiO, Ga-doped ZnSiO, In-doped ZnSiO, or a combination thereof.

The electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

For example, the electron transport region may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), —P($Q_{601}$)($Q_{602}$), or —P(=O)($Q_{601}$)($Q_{602}$), $Q_{601}$ to $Q_{603}$ are each as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or greater, two or more of $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

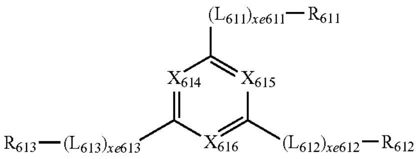

wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ are each as described in connection with $L_{601}$, xe611 to xe613 are each as described in connection with xe1, $R_{611}$ to $R_{613}$ are each as described in connection with $R_{601}$, and $R_{614}$ to $R_{616}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_1$-$C_{60}$ alkylthio group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), tris(8-hydroxy-quinolinato)aluminum ($Alq_3$), bis(2-methyl-8-quinolinolato-N1,O8)-(1,1'-biphenyl-4-olato)aluminum (BAlq), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or a combination thereof:

ET1

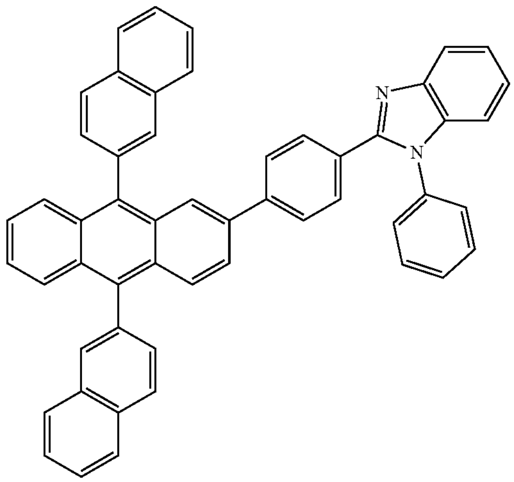

ET2

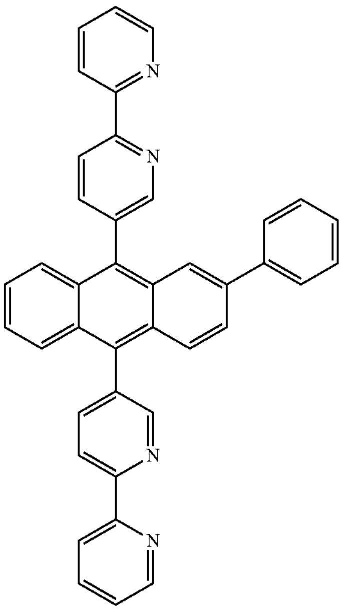

-continued
ET3
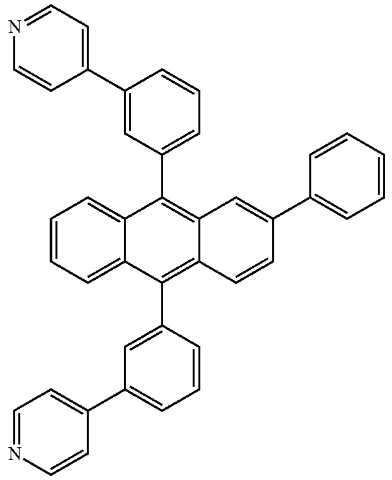
ET4
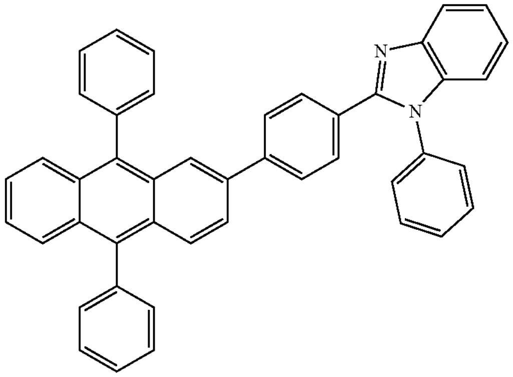
ET5
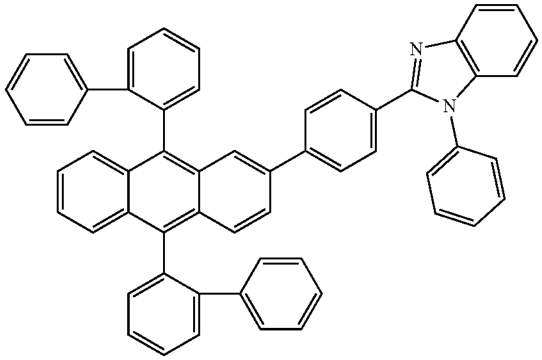
ET6
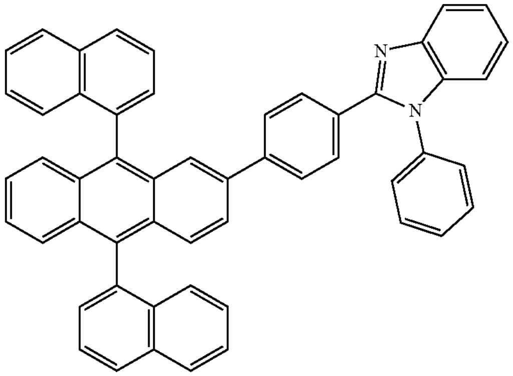
ET7
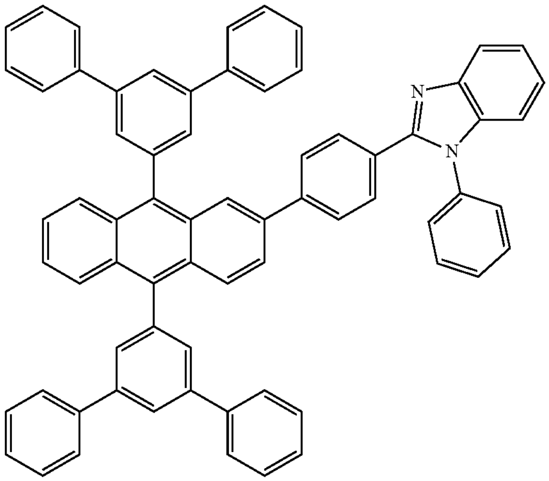
ET8
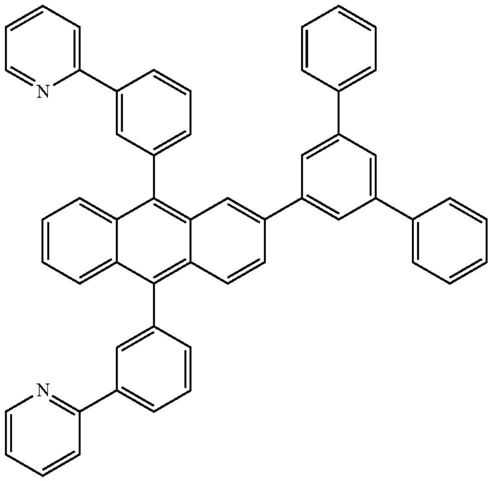

-continued
ET9
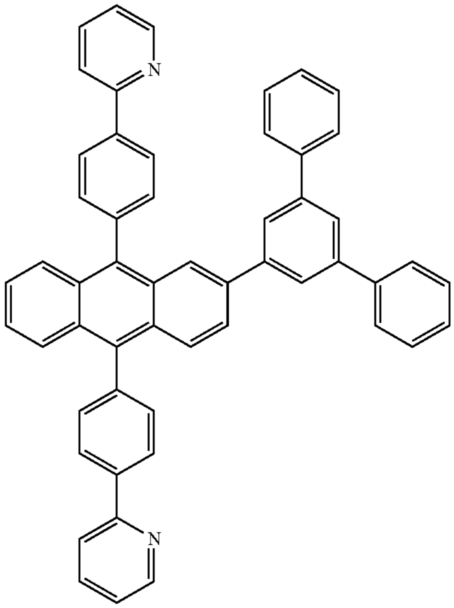
ET10
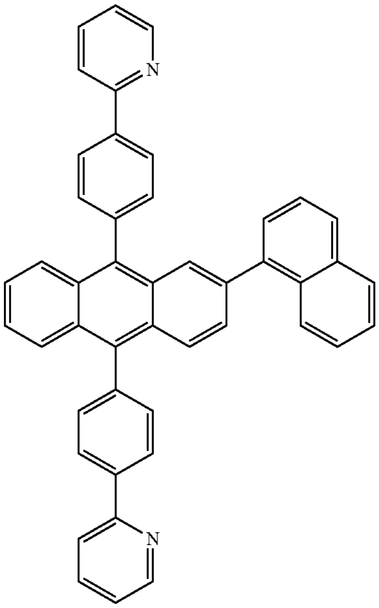
ET11
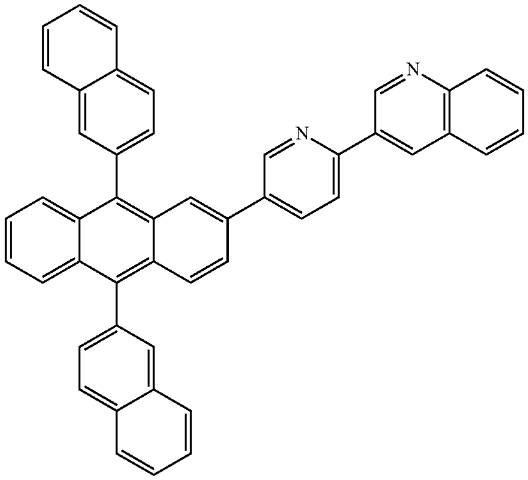
ET12
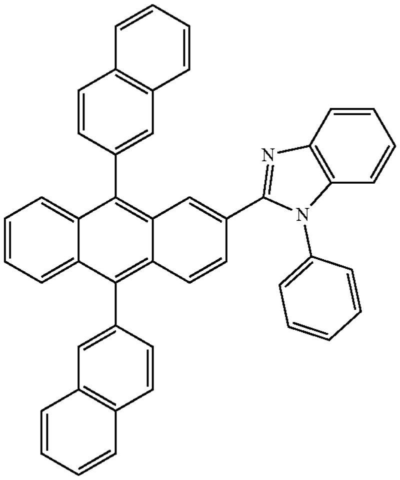
ET13
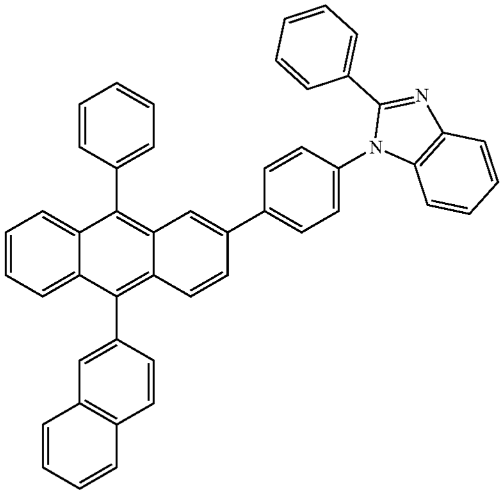
ET14
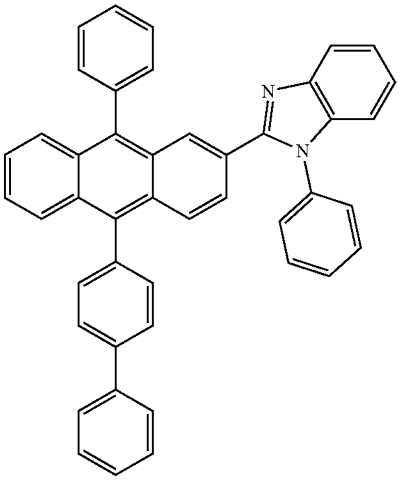

-continued
ET15
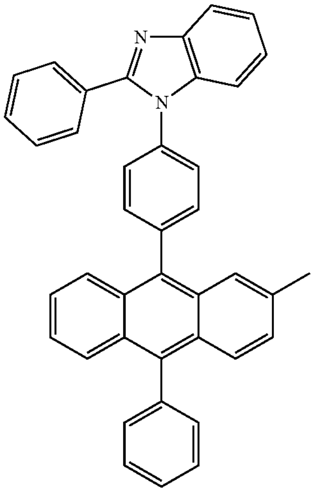
ET16
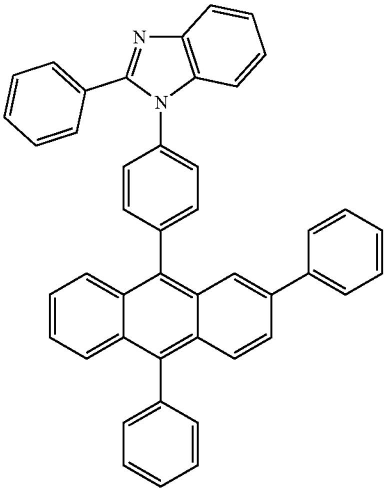
ET17
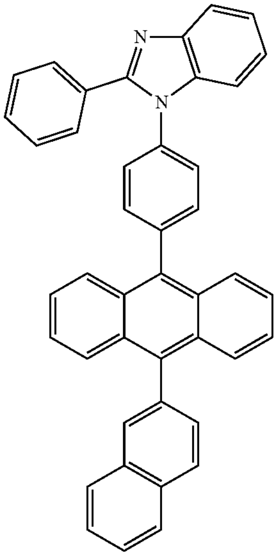
ET18
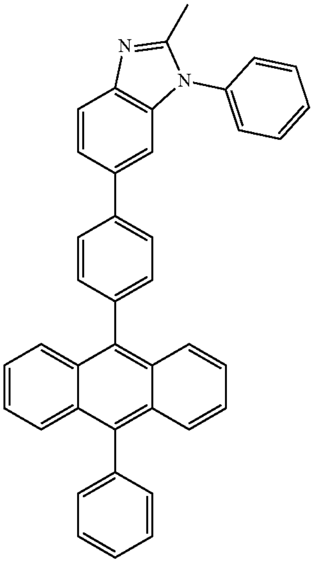
ET19
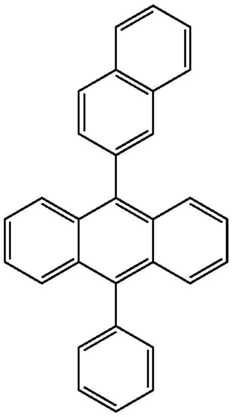
ET20
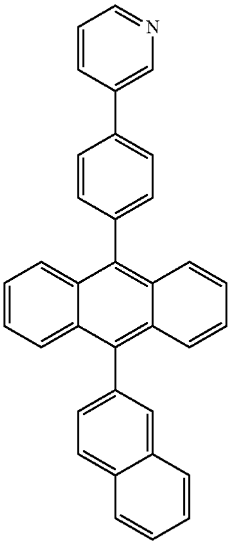

-continued
ET21
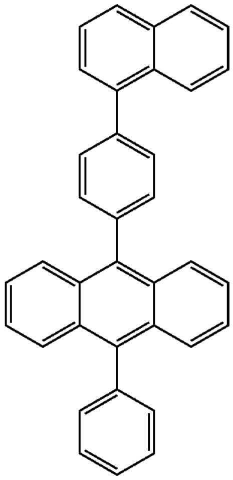
ET22
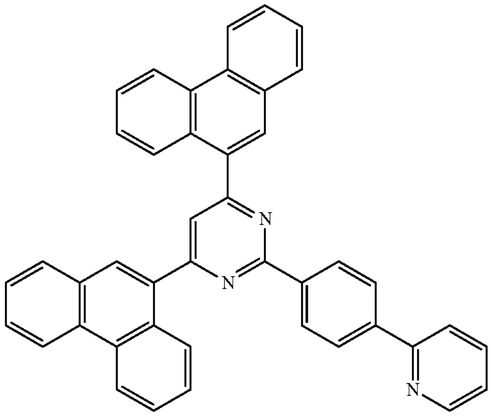
ET23
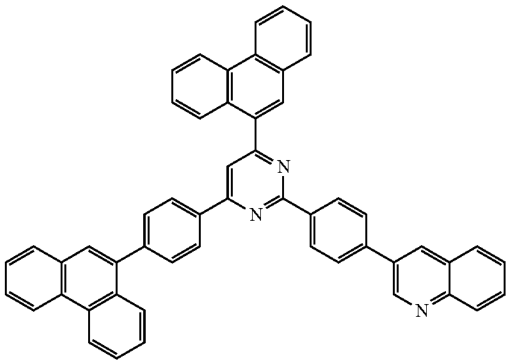
ET24
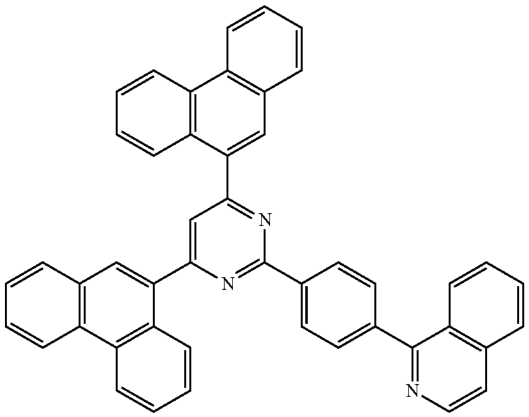
ET25
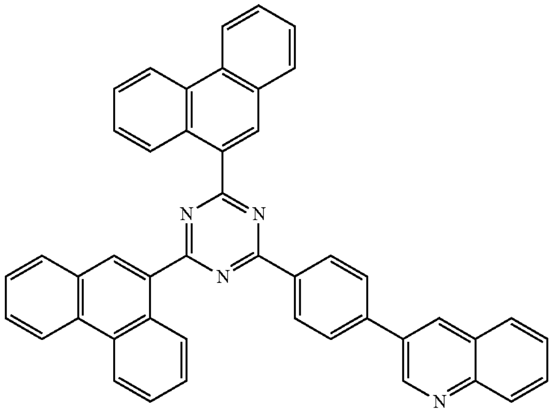
ET26
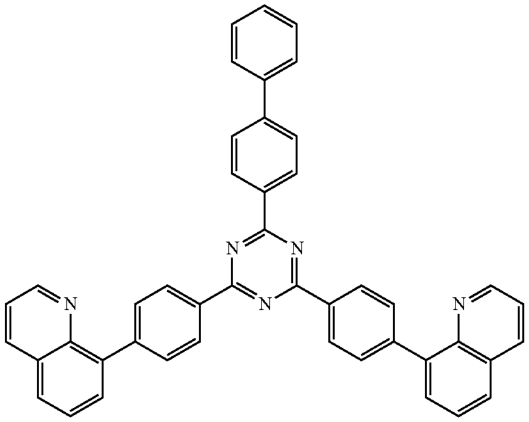

-continued
ET27
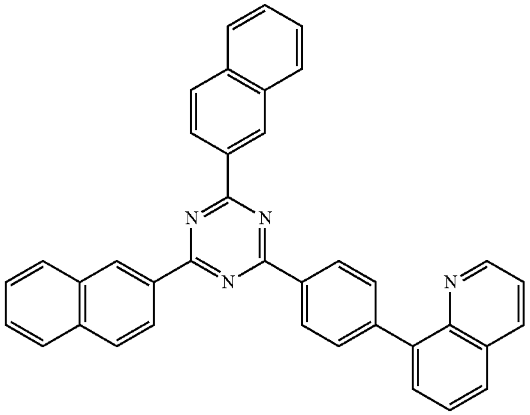
ET28
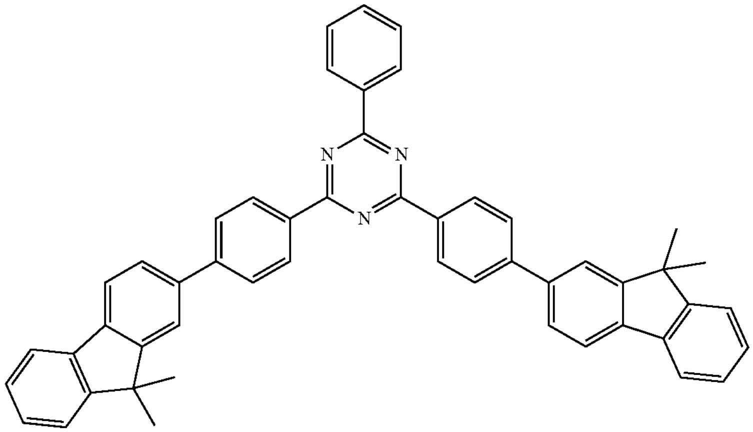
ET29
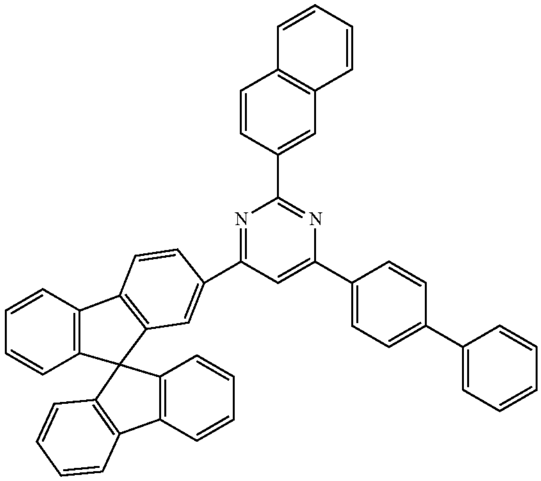
ET30
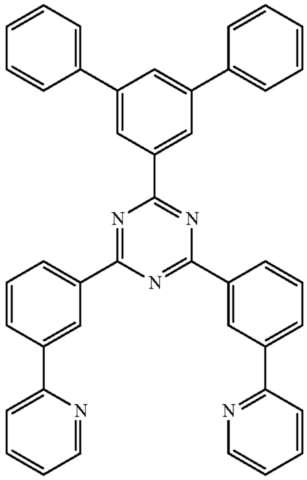

-continued
ET31
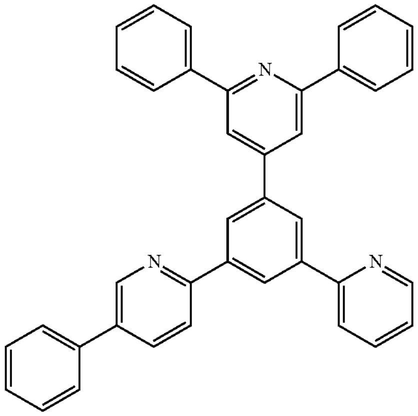
ET32
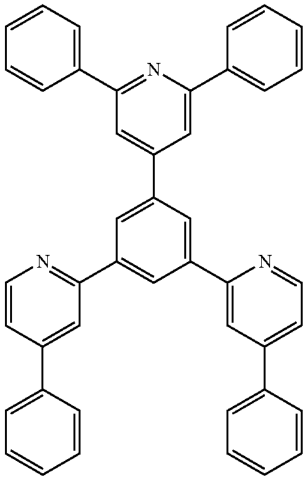
ET33
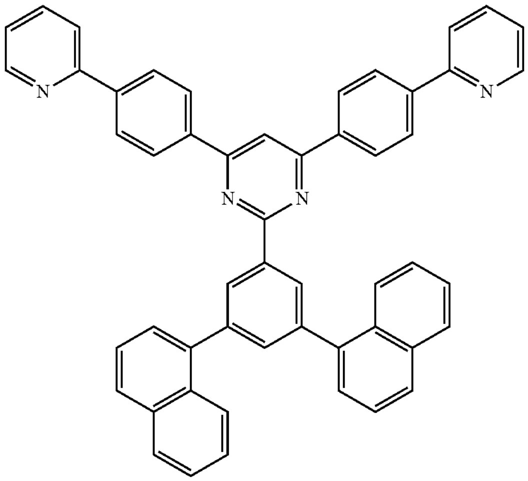
ET34
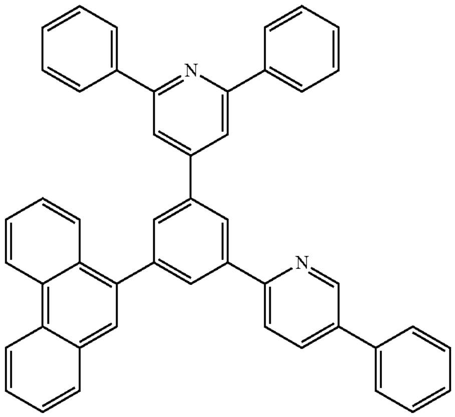
ET35
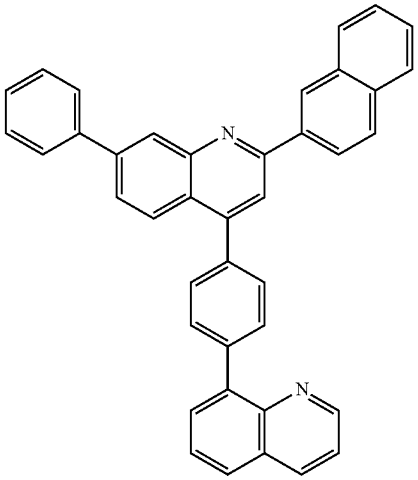
ET36
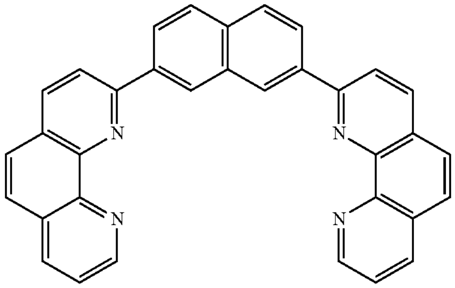

-continued
ET37
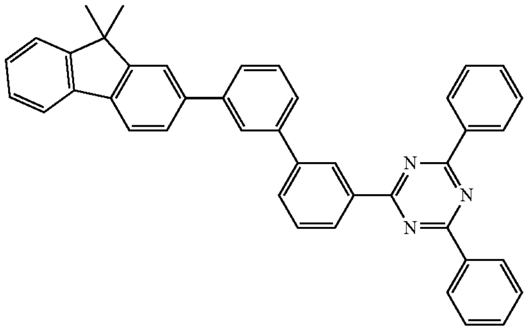
ET38
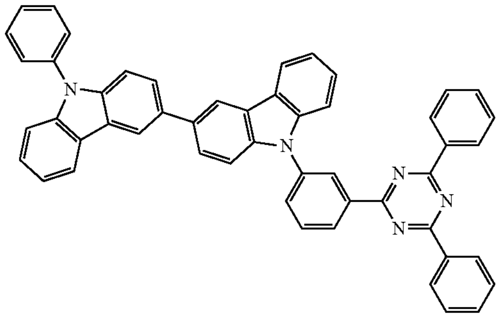
ET39
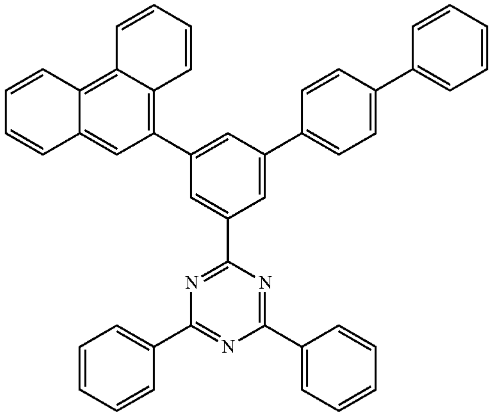
ET40
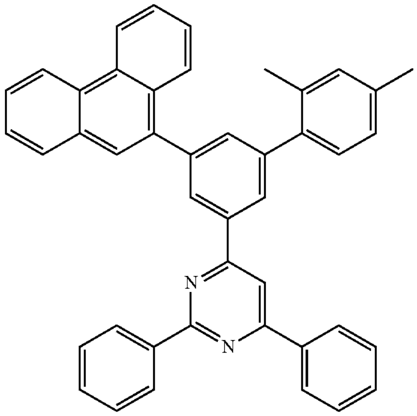
ET41
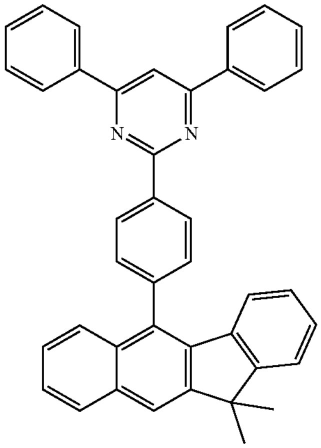
ET42
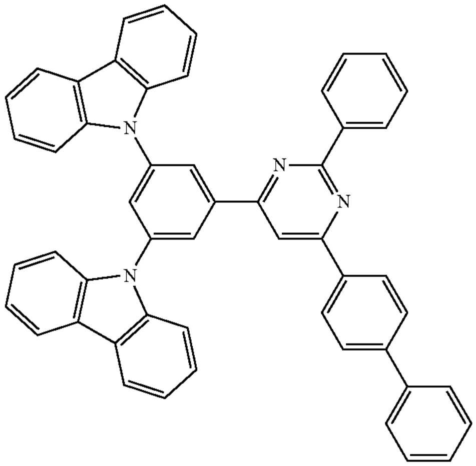

-continued

ET43

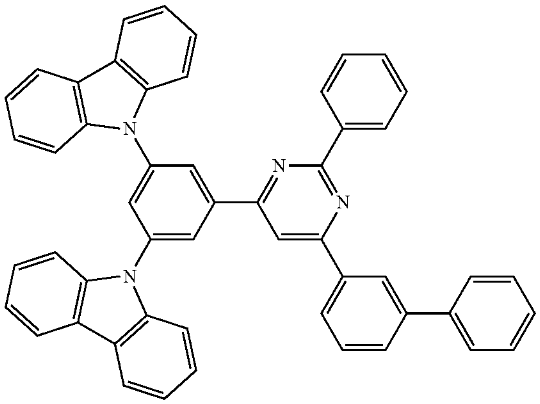

ET44

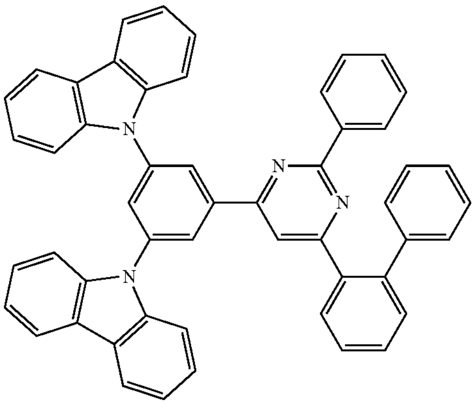

ET45

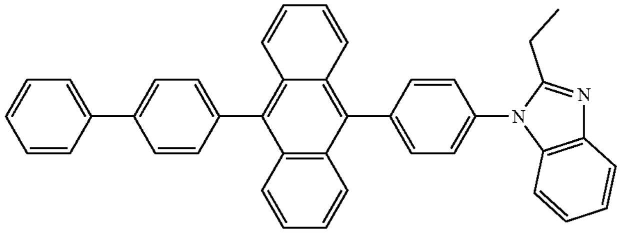

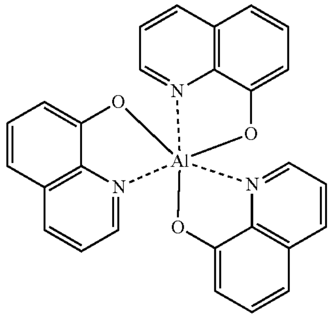

Alq3

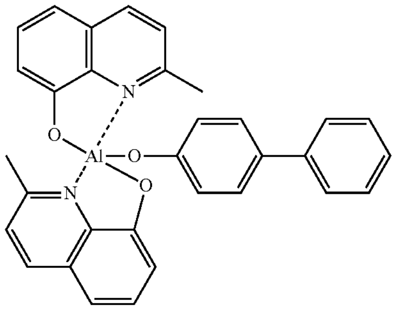

BAlq

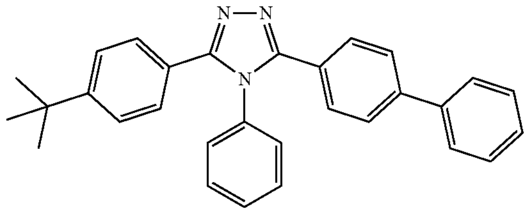

TAZ

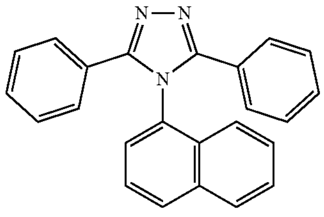

NTAZ

A thickness of the electron transport region may be in a range of about 100 Å to about 5,000 Å, for example, about 160 Å to about 4,000 Å. When the electron transport region includes a buffer layer, a hole blocking layer, an electron control layer, an electron transport layer, or a combination thereof, a thickness of the buffer layer, the hole blocking layer, or the electron control layer may each independently be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or a combination thereof. A metal ion of the alkali metal complex may be a Li ion, a Na ion, a K ion, a Rb ion, a Cs ion, or a combination thereof, and a metal ion of the alkaline earth metal complex may be a Be ion, a Mg ion, a Ca ion, a Sr ion, a Ba ion, or a combination thereof. A ligand coordinated with the metal ion of the alkali metal complex or the alkaline earth-metal complex may include hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or a combination thereof.

For example, the metal-containing material may include a Li complex. The Li complex may include, for example, Compound ET-D1 (LiQ) or ET-D2:

ET-D1

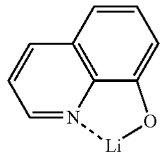

ET-D2

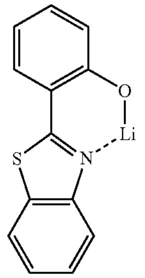

The electron transport region may include an electron injection layer that facilitates the injection of electrons from the second electrode 150. The electron injection layer may be in direct contact with the second electrode 150.

The electron injection layer may have i) a single-layered structure including or consisting of a single layer consisting of a single material, ii) a single-layered structure including or consisting of a single layer consisting of a plurality of different materials, or iii) a multi-layered structure including or consisting of a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof.

The alkali metal may include Li, Na, K, Rb, Cs, or a combination thereof. The alkaline earth metal may include Mg, Ca, Sr, Ba, or a combination thereof. The rare earth metal may include Sc, Y, Ce, Tb, Yb, Gd, or a combination thereof.

The alkali metal-containing compound, the alkaline earth metal-containing compound, and the rare earth metal-containing compound may be oxides, halides (for example, fluorides, chlorides, bromides, iodides, etc.), or tellurides of the alkali metal, the alkaline earth metal, and the rare earth metal, or a combination thereof.

The alkali metal-containing compound may include: alkali metal oxides, such as $Li_2O$, $Cs_2O$, $K_2O$, or a combination thereof; alkali metal halides, such as LiF, NaF, CsF, KF, LiI, NaI, CsI, KI, or a combination thereof; or a combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), or a combination thereof. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or a combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, or a combination thereof.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or a combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof, as described herein. In one or more embodiments, the electron injection layer may further include an organic material (for example, a compound represented by Formula 601).

In one or more embodiments, the electron injection layer may consist of i) an alkali metal-containing compound (for example, alkali metal halide), ii) a) an alkali metal-containing compound (for example, alkali metal halide); and b) an alkali metal, an alkaline earth metal, a rare earth metal, or a combination thereof. For example, the electron injection layer may be a KI:Yb co-deposited layer, an RbI:Yb co-deposited layer, a LiF:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or a combination thereof may be uniformly or non-uniformly dispersed in a matrix including the organic material.

A thickness of the electron injection layer may be in a range of about 1 Å to about 100 Å, for example, about 3 Å to about 90 Å. When the thickness of the electron injection layer is within this range, satisfactory electron injection characteristics may be obtained without a substantial increase in driving voltage.

Second Electrode 150

The second electrode 150 may be disposed on the interlayer 130 as described herein. The second electrode 150 may be a cathode, which is an electron injection electrode, and as a material for forming the second electrode 150, a metal, an alloy, an electrically conductive compound, or a combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including a plurality of layers.

Capping Layer

A first capping layer may be located outside the first electrode 110, and/or a second capping layer may be located outside the second electrode 150. In particular, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

Light generated in the emission layer of the interlayer 130 of the light-emitting device 10 may be extracted toward the outside through the first electrode 110, which is a semi-transmissive electrode or a transmissive electrode, and the first capping layer. Light generated in the emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external luminescence efficiency according to the principle of constructive interference. Accordingly, the light extraction efficiency of the light-emitting device 10 may be increased, so that the luminescence efficiency of the light-emitting device 10 may be improved.

Each of the first capping layer and the second capping layer may include a material having a refractive index of about 1.6 or greater (at 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or a combination thereof. The carbocyclic compound, the heterocyclic compound, and the amine group-containing compound may optionally be substituted with a substituent including O, N, S, Se, Si, F, Cl, Br, I, or a combination thereof.

In one or more embodiments, at least one of the first capping layer and the second capping layer may each independently include an amine group-containing compound.

For example, at least one of the first capping layer and the second capping layer may each independently include a compound represented by Formula 201, a compound represented by Formula 202, or a combination thereof.

In one or more embodiments, at least one of the first capping layer and the second capping layer may each independently include one of Compounds HT28 to HT33, one of Compounds CP1 to CP6, β-NPB, or a combination thereof:

CP1

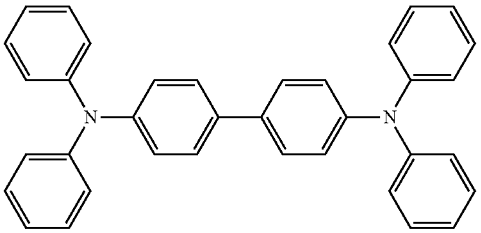

CP2

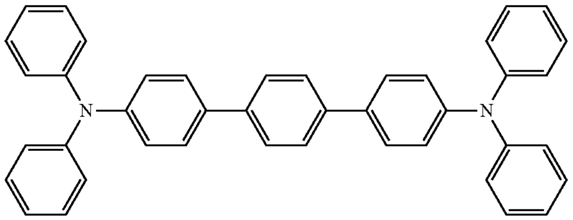

CP3

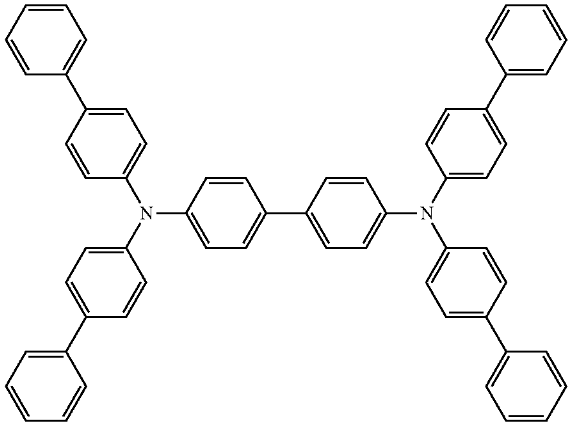

CP4

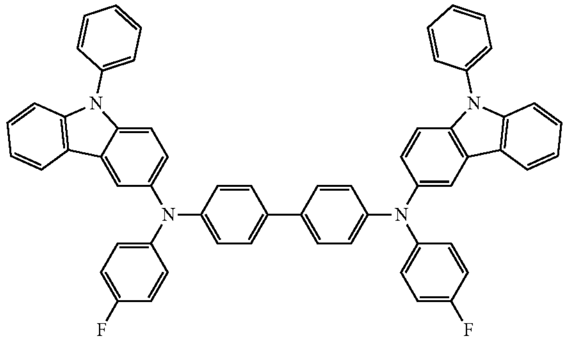

CP5

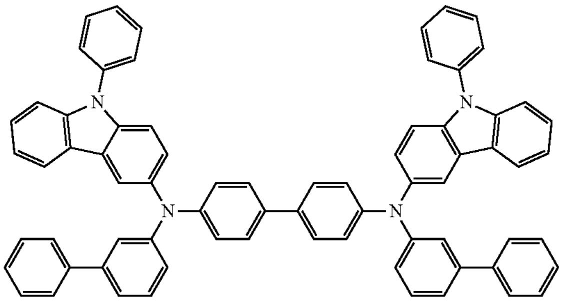

-continued

CP6

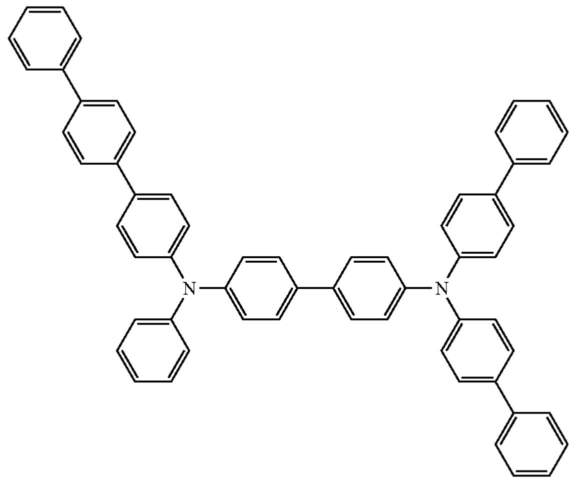

β-NPB

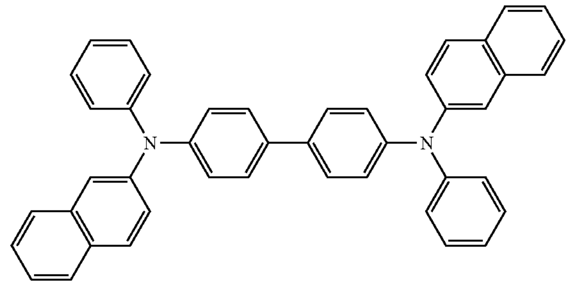

Electronic Apparatus

The light-emitting device may be included in various electronic apparatuses. For example, the electronic apparatus including the light-emitting device may be a light-emitting apparatus, an authentication apparatus, or the like.

The electronic apparatus (for example, a light-emitting apparatus) may further include, in addition to the light-emitting device, i) a color filter, ii) a color conversion layer, or iii) a color filter and/or a color conversion layer. The color filter and/or the color conversion layer may be located in at least one traveling direction of light emitted from the light-emitting device. For example, the light emitted from the light-emitting device may be blue light or white light. The light-emitting device is as described above. In one or more embodiments, the color conversion layer may include a quantum dot. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel defining film may be located among the subpixel areas to define each of the subpixel areas.

The color filter may further include a plurality of color filter areas and light-shielding patterns located among the color filter areas, and the color conversion layer may further include a plurality of color conversion areas and light-shielding patterns located among the color conversion areas.

The color filter areas (or the color conversion areas) may include a first area emitting a first color light, a second area emitting a second color light, and/or a third area emitting a third color light, and the first color light, the second color light, and/or the third color light may have different maximum emission wavelengths. For example, the first color light may be a red light, the second color light may be a green light, and the third color light may be a blue light. For example, the color filter areas (or the color conversion areas) may include quantum dots. In particular, the first area may include a red quantum dot, the second area may include a green quantum dot, and the third area may not include a quantum dot. The quantum dot is as described herein. The first area, the second area, and/or the third area may each further include a scatterer.

For example, the light-emitting device may emit first light, the first area may absorb the first light to emit a first-first color light, the second area may absorb the first light to emit a second-first color light, and the third area may absorb the first light to emit a third-first color light. In this regard, the first-first color light, the second-first color light, and the third-first color light may have different maximum emission wavelengths. In particular, the first light may be a blue light, the first-first color light may be a red light, the second-first color light may be a green light, and the third-first color light may be a blue light.

The electronic apparatus may further include a thin-film transistor, in addition to the light-emitting device as described above. The thin-film transistor may include a source electrode, a drain electrode, and an activation layer, wherein one of the source electrode and the drain electrode may be electrically connected to one of the first electrode and the second electrode of the light-emitting device.

The thin-film transistor may further include a gate electrode, a gate insulating film, or the like.

The activation layer may include crystalline silicon, amorphous silicon, an organic semiconductor, an oxide semiconductor, or the like.

The electronic apparatus may further include a sealing portion for sealing the light-emitting device. The sealing portion may be located between the color filter and/or the color conversion layer and the light-emitting device. The sealing portion allows light from the light-emitting device to be extracted to the outside, and simultaneously prevents ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin-film encapsulating layer, the electronic apparatus may be flexible.

Various functional layers may be additionally disposed on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infrared touch screen layer.

The authentication apparatus may further include, in addition to the light-emitting device as described herein, a biometric information collector. The authentication apparatus may be, for example, a biometric authentication apparatus that authenticates an individual by using biometric information of a living body (for example, fingertips, pupils, or the like).

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, or the like.

Figure 3:
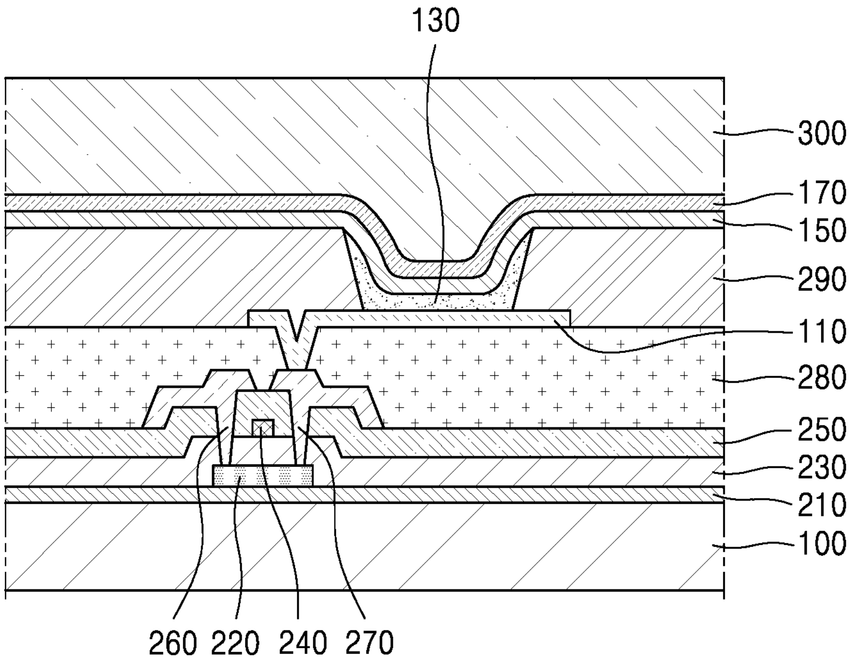
FIG. 3 is a schematic view of a structure of an electronic apparatus according to one or more embodiments.
Figure 4:
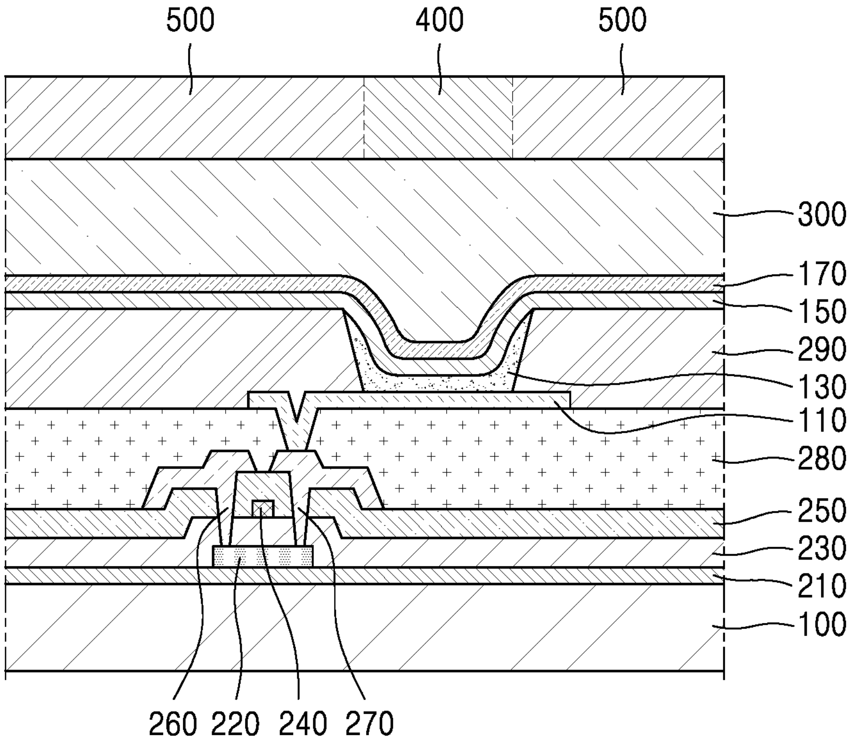
FIG. 4 is a schematic view of a structure of an electronic apparatus according to another embodiment.

Description of FIGS. 3 and 4

FIG. 3 is a cross-sectional view of a light-emitting apparatus according to one or more embodiments.

The light-emitting apparatus of FIG. 3 may include a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be disposed on the substrate 100. The buffer layer 210 may prevent penetration of impurities through the substrate 100 and may provide a flat surface on the substrate 100.

The TFT may be disposed on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be disposed on the activation layer 220, and the gate electrode 240 may be disposed on the gate insulating film 230.

An interlayer insulating film 250 may be disposed on the gate electrode 240. The interlayer insulating film 250 may be located between the gate electrode 240 and the source electrode 260 and between the gate electrode 240 and the drain electrode 270 to provide insulation therebetween.

The source electrode 260 and the drain electrode 270 may be disposed on the interlayer insulating film 250. The interlayer insulating film 250 and the gate insulating film 230 may be formed to expose the source region and the drain region of the activation layer 220, and the source electrode 260 and the drain electrode 270 may be located in contact with the exposed portions of the source region and the drain region of the activation layer 220.

The TFT may be electrically connected to a light-emitting device to drive the light-emitting device, and may be covered and protected by a passivation layer 280. The passivation layer 280 may include an inorganic insulating film, an organic insulating film, or a combination thereof. A light-emitting device may be provided on the passivation layer 280. The light-emitting device may include a first electrode 110, an interlayer 130, and a second electrode 150.

The first electrode 110 may be disposed on the passivation layer 280. The passivation layer 280 may be located to expose a certain region of the drain electrode 270 without fully covering the drain electrode 270, and the first electrode 110 may be located to be connected to the exposed region of the drain electrode 270.

A pixel defining layer 290 including an insulating material may be disposed on the first electrode 110. The pixel defining layer 290 may expose a certain region of the first electrode 110, and the interlayer 130 may be formed in the exposed region of the first electrode 110. The pixel defining layer 290 may be a polyimide or polyacrylic organic film. Although not shown in FIG. 3, at least some layers of the interlayer 130 may extend beyond the upper portion of the pixel defining layer 290 to be located in the form of a common layer.

The second electrode 150 may be disposed on the interlayer 130, and a capping layer 170 may be additionally formed on the second electrode 150. The capping layer 170 may be formed to cover the second electrode 150.

The encapsulation portion 300 may be disposed on the capping layer 170. The encapsulation portion 300 may be disposed on a light-emitting device to protect the light-emitting device from moisture or oxygen. The encapsulation portion 300 may include an inorganic film including a silicon nitride (SiNx), a silicon oxide (SiOx), indium tin oxide, indium zinc oxide, or a combination thereof; an organic film including polyethylene terephthalate, polyethylene naphthalate, a polycarbonate, a polyimide, polyethylene sulfonate, a polyoxymethylene, a polyarylate, hexamethyldisiloxane, a (meth)acrylic resin (for example, polymethyl (meth)acrylate, polyacrylic acid, or the like), an epoxy-containing resin (for example, aliphatic glycidyl ether (AGE), or the like), or a combination thereof; or a combination of the inorganic film and the organic film.

FIG. 4 is a cross-sectional view of a light-emitting apparatus according to another embodiment.

The light-emitting apparatus of FIG. 4 is similar to the light-emitting apparatus of FIG. 3, except that a light-shielding pattern 500 and a functional region 400 are additionally disposed on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

Manufacturing Methods

Respective layers included in the hole transport region, the emission layer, and respective layers included in the electron transport region may be formed in a certain region by using various methods such as vacuum deposition, spin coating, casting, Langmuir-Blodgett (LB) deposition, ink-jet printing, laser-printing, laser-induced thermal imaging, or the like. For example, the emission layer may be formed by ink-jet printing.

When the layers included in the hole transport region, the emission layer, and the layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 angstroms per second (Å/sec) to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of carbon only as a ring-forming atom and having 3 to 60 carbon atoms, and the term "$C_1$-$C_{60}$ heterocyclic group" as used herein refers to a cyclic group that has 1 to 60 carbon atoms and further has, in addition to carbon, a at least one heteroatom selected from N, O, P, Ge, Se, Si, and S as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group may have 3 to 61 ring-forming atoms.

The term "cyclic group" as used herein may include both the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has 3 to 60 carbon atoms and does not include *—N=*' as a ring-forming moiety. The term "π electron-deficient nitrogen-containing $C_1$-$C_{60}$ cyclic group" as used herein refers to a heterocyclic group that has 1 to 60 carbon atoms and includes *—N=*' as a ring-forming moiety.

For example, the $C_3$-$C_{60}$ carbocyclic group may be i) a T1 group or ii) a condensed cyclic group in which at least two T1 groups are condensed with each other (for example, a cyclopentadiene group, an adamantane group, a norbornane group, a phenyl group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which at least two T2 groups are condensed with each other, or iii) a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like), the π electron-rich $C_3$-$C_{60}$ cyclic group may be i) a T1 group, ii) a condensed cyclic group in which at least two T1 groups are condensed with each other, iii) a T3 group, iv) a condensed cyclic group in which at least two T3 groups are condensed with each other, or v) a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, or the like), the π electron-deficient nitrogen-containing $C_1$-$C_{60}$ cyclic group may be i) a T4 group, ii) a condensed cyclic group in which at least two T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a phenyl group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the $\pi$ electron-rich $C_3$-$C_{60}$ cyclic group, or the $\pi$ electron-deficient nitrogen-containing $C_1$-$C_{60}$ cyclic group" as used herein refer to a group condensed to any cyclic group, a monovalent group, or a polyvalent group (for example, a divalent group, a trivalent group, a tetravalent group, etc.) according to the structure of a formula for which the corresponding term is used. For example, the "benzene group" or "phenyl group" may be a benzo group, a phenyl group, a phenylene group, or the like, which may be easily understood by one of ordinary skill in the art according to the structure of a formula including the "benzene group" or "phenyl group."

Non-limiting examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and non-limiting examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has 1 to 60 carbon atoms, and non-limiting examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and non-limiting examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by $-OA_{101}$ (wherein $A_{101}$ is the $C_1$-$C_{60}$ alkyl group), and non-limiting examples thereof include a methoxy group, an ethoxy group, and an isopropyloxy group.

The term "$C_1$-$C_{60}$ alkylthio group" as used herein refers to a monovalent group represented by $-SA_{101}$ (wherein $A_{101}$ is the $C_1$-$C_{60}$ alkyl group).

The term "$C_3$-$C_{10}$ cycloalkyl group" as used herein refers to a monovalent saturated hydrocarbon cyclic group having 3 to 10 carbon atoms, and non-limiting examples thereof include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group of 1 to 10 carbon atoms, further including, in addition to carbon atoms, at least one heteroatom selected from N, O, P, Ge, Se, Si, and S as ring-forming atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group of 1 to 10 carbon atoms, further including, in addition to carbon atoms, at least one heteroatom selected from N, O, P, Ge, Se, Si, and S, as ring-forming atoms, and having at least one carbon-carbon double bond in the cyclic structure thereof. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms, and the term "$C_6$-$C_{60}$ arylene group" as used herein refers to a divalent group having a carbocyclic aromatic system of 6 to 60 carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be condensed with each other.

The term "$C_1$-$C_{60}$ heteroaryl group" as used herein refers to a monovalent group having a heterocyclic aromatic system of 1 to 60 carbon atoms, further including, in addition to carbon atoms, at least one heteroatom selected from N, O, P, Ge, Se, Si, and S, as ring-forming atoms. The term "$C_1$-$C_{60}$ heteroarylene group" as used herein refers to a divalent group having a heterocyclic aromatic system of 1 to 60 carbon atoms, further including, in addition to carbon atoms, at least one heteroatom, as ring-forming atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Non-limiting examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, further including, in addition to carbon atoms, at least one heteroatom selected from N, O, P, Ge, Se, Si, and S, as ring-forming atoms, and having non-aromaticity in its entire molecular structure. Non-limiting examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "$C_1$-$C_{60}$ heteroaryloxy group" as used herein refers to —$OA_{102}$ (wherein $A_{102}$ is the $C_1$-$C_{60}$ heteroaryl group), and the term "$C_1$-$C_{60}$ heteroarylthio group" as used herein refers to —$SA_{103}$ (wherein $A_{103}$ is the $C_1$-$C_{60}$ heteroaryl group).

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$R_{10a}$" as used herein refers to:

deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, a $C_1$-$C_{60}$ heteroarylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(Q_{11})(Q_{12})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, or a $C_1$-$C_{60}$ heteroarylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, a $C_1$-$C_{60}$ heteroarylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(Q_{21})(Q_{22})$, —$P(=O)(Q_{21})(Q_{22})$, or a combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(Q_{31})(Q_{32})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ used herein may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_7$-$C_{60}$ aryl alkyl group, a $C_7$-$C_{60}$ alkyl aryl group, a $C_6$-$C_{60}$ aryloxy group, a $C_6$-$C_{60}$ arylthio group, a $C_2$-$C_{60}$ heteroaryl alkyl group, a $C_2$-$C_{60}$ alkyl heteroaryl group, a $C_1$-$C_{60}$ heteroaryloxy group, or a $C_1$-$C_{60}$ heteroarylthio group.

The term "heteroatom" as used herein refers to any atom other than a carbon atom. Examples of the heteroatom include O, S, N, P, Si, B, Ge, Se, or a combination thereof.

"Ph" as used herein refers to a phenyl group, "Me" as used herein refers to a methyl group, "Et" as used herein refers to an ethyl group, "tert-Bu" or "$Bu^t$" as used herein refers to a tert-butyl group, and "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, compounds according to exemplary embodiments and light-emitting devices according to exemplary embodiments will be described in further detail with reference to Synthesis Examples and Examples. The wording "B was used instead of A" used in describing Synthesis Examples means that an identical molar equivalent of B was used in place of A.

EXAMPLES

Synthesis Example 1-1

4 millimoles (mmol) of indium acetate and 12 mmol of palmitic acid were injected into a 250 mL three-neck flask together with 100 mL of octadecene, the reaction solution was heated at a temperature of 120° C. for 1 hour in a vacuum atmosphere, and then, the atmosphere was switched to an argon atmosphere, thereby preparing an $In(PA)_3$ solution. After the temperature of the $In(PA)_3$ solution was raised to 280° C., the solution was maintained for 1 hour, 10 mL of tris(trimethylsilyl)phosphine/trioctylphosphine (0.2 molar (M)) was rapidly injected thereto using a syringe, and then, crystals were grown at a temperature of 260° C. for 30 minutes. Afterwards, 52 mL of an $In(PA)_3$ solution (0.2 M) and 26 mL of tris(trimethylsilyl)phosphine/trioctylphosphine (0.2 M) were injected thereto at rates of 1.5 milliliters per minute (mL/min) and 0.75 ml/min, respectively, for 35 minutes. Afterwards, after 10 minutes of stabilization time, the temperature of the reactor was allowed to cool to room temperature by removing the heat source, thereby synthesizing an InP core. The synthesized InP core underwent a purification process wherein 40 mL of acetone and 10 mL of ethanol were mixed per 10 mL of an InP core solution, the reaction solution was centrifuged at 9,000 revolutions per minute (rpm), the supernatant was removed therefrom, and then, the precipitate was dispersed in toluene. The synthesized InP core was subjected to a surface treatment to form a shell. 1.6 mmol of zinc acetate, 3.2 mmol of oleic acid (OA), and 80 mL of trioctylamine were mixed, and then, the reaction solution was mixed in a vacuum atmosphere at a temperature of 120° C. for 1 hour. After the atmosphere was switched to an argon atmosphere, the reaction solution was maintained at a temperature of 280° C. for 1 hour, the temperature was lowered to 180° C., and then, 12 mL of the InP core solution dispersed in toluene was rapidly injected thereto using a syringe. After 5 minutes, 0.2 mL of a HF solution (10 wt % in acetone) was injected thereto, and then, the reaction solution was maintained for 10 minutes, thereby preparing a surface-treated InP core solution. The temperature of the reactor was raised to 320° C. 15 mmol of $Zn(OA)_2$ (0.4 M) was added thereto, followed by injection of 4.0 mmol of Se/trioctylphosphine, and then, a ZnSe shell was grown for 1 hour. Afterwards, 3.0 mmol of S/trioctylphosphine was injected thereto, and then, the ZnS shell was grown for 1 hour.

Synthesis Example 1-2

After InP/ZnSe/ZnS was synthesized in a similar manner as in Synthesis Example 1-1, 1 mmol of $ZnCl_2$ dissolved in ethanol was added thereto, and the reaction solution was mixed and then purified.

Synthesis Example 1-3

After InP/ZnSe/ZnS was synthesized in a similar manner as in Synthesis Example 1-1, 1 mmol of 4-methoxycinnammic acid dissolved in isopropanol was added thereto, and the reaction solution was mixed and then purified.

Synthesis Example 2-1

4 mmol of indium acetate and 12 mmol of palmitic acid were injected into a 250 mL three-neck flask together with 100 m L of octadecene, the reaction solution was heated at a temperature of 120° C. for 1 hour in a vacuum atmosphere, and then, the atmosphere was switched to an argon atmosphere, thereby preparing an $In(PA)_3$ solution. After the temperature of the $In(PA)_3$ solution was raised to 240° C., 10 mL of tris(trimethylsilyl)phosphine/trioctylphosphine (0.4 M) was rapidly injected thereto using a syringe. Afterwards, the temperature of the reactor was cooled to room temperature by removing the heat source, thereby synthesizing an InP core. The synthesized InP core underwent a purification process in which 40 mL of acetone and 10 mL of ethanol were mixed per 10 mL of an InP core solution, the reaction solution was centrifuged at 9,000 rpm, the supernatant was removed therefrom, and then, the precipitate was dispersed in toluene. The synthesized InP core was subjected to a surface treatment to form a shell. 1.6 mmol of zinc acetate, 3.2 mmol of OA, and 80 mL of trioctylamine were mixed, and then, the reaction solution was mixed in a vacuum atmosphere at a temperature of 120° C. for 1 hour. After the atmosphere was switched to an argon atmosphere, the reaction solution was maintained at a temperature of 280° C. for 1 hour, the temperature was lowered to 180° C., and then, 12 mL of the InP core solution dispersed in toluene was rapidly injected thereto using a syringe. After 5 minutes, 0.2 mL of a HF solution (10 wt % in acetone) was injected thereto, and then, the reaction solution was maintained for 10 minutes, thereby preparing a surface-treated InP core solution. The temperature of the reactor was raised to 320° C. 15 mmol of $Zn(OA)_2$ (0.4 M) was added thereinto, followed by injection of 4.0 mmol of Se/trioctylphosphine, and then, a ZnSe shell was grown for 1 hour. Afterwards, 3.0 mmol of S/trioctylphosphine was injected thereto, and then, ZnS shell was grown for 1 hour.

Synthesis Example 2-2

After InP/ZnSe/ZnS was synthesized in a similar manner as in Synthesis Example 2-1, 1 mmol of $ZnCl_2$ dissolved in ethanol was added thereto, and the reaction solution was mixed and then purified.

Synthesis Example 2-3

After InP/ZnSe/ZnS was synthesized in a similar manner as in Synthesis Example 2-1, 1 mmol of 4-Methoxycinnammic acid dissolved in isopropanol was added thereto, and the reaction solution was mixed and then purified.

Synthesis Example 3-1

2 mmol of zinc acetate, 2 mL of OA, and 15 mL of 1-octadecene (ODE) were placed in a three-neck flask, and vacuum was applied thereto at a temperature of 120° C. until the reaction mixture was dissolved into a transparent solution. Afterwards, Se-DPP (1 mmol of Se in 0.5 mL of diphenylphosphine (DPP)) and Te-TOP (0.349 mmol of Te in 0.8 mL of trioctylphosphine (TOP)) that were prepared in advance were sequentially injected thereto at a temperature of 220° C., and the reaction solution was held for 30 minutes and then further reacted at a temperature of 300° C. for 1 hour. Afterwards, the temperature was lowered, an excess amount of EtOH was added thereto, and the reaction solution was precipitated and then dispersed in hexane.

3 mmol of zinc acetate, 2 mL of OA, and 10 mL of trioctylamine (TOA) were placed in a three-neck flask, and vacuum was applied thereto at a temperature of 120° C. until the reaction mixture was dissolved into a transparent solution. Afterwards, a ZnSeTe core that was previously synthesized was injected thereto, vacuum was applied thereto for 5 minutes, HF was injected thereto, and then, vacuum was applied thereto for 10 minutes. The temperature of the reaction solution was raised to 240° C., 4 mL of Zn-oleate (0.5 M) and 0.6 mL of Se-TOP (2 M) were injected thereto, and then, the temperature was raised to 340° C., thereby growing a ZnSe shell.

After ZnSeTe/ZnSe was synthesized, 3 m L of Zn-oleate (0.5 M) and 1.2 m L of S-TOP (2 M) was additionally injected thereto at a temperature of 340° C., and then, the reaction solution was reacted for 30 minutes, thereby growing a ZnS shell.

Synthesis Example 3-2

After ZnTeSe/ZnSe/ZnS was synthesized in a similar manner as in Synthesis Example 3-1, 1 mmol of $ZnCl_2$ dissolved in ethanol was added thereto, and the reaction solution was mixed and then purified.

Synthesis Example 3-3

After ZnTeSe/ZnSe/ZnS was synthesized in a similar manner as in Synthesis Example 3-1, 2 mmol of $ZnCl_2$ dissolved in ethanol was added thereto, and the reaction solution was mixed and then purified.

Synthesis Example 3-4

After ZnTeSe/ZnSe/ZnS was synthesized in a similar manner as in Synthesis Example 3-1, 1 mmol of 4-Methoxycinnammic acid dissolved in isopropanol was added thereto, and the reaction solution was mixed and then purified.

Synthesis Example 3-5

After ZnTeSe/ZnSe/ZnS was synthesized in a similar manner as in Synthesis Example 3-1, 1 mmol of 4-(dimethylamino)cinnamic acid dissolved in isopropanol was added thereto, and the reaction solution was mixed and then purified.

TABLE 1

| | Quantum dot (core/first shell/ second shell) | Emission color | Ligand |
|---|---|---|---|
| Synthesis Example 1-1 | InP/ZnSe/Zns | Red | Oleic acid |
| Synthesis Example 1-2 | | | Halide (Cl) |
| Synthesis Example 1-3 | | | 4-methoxycinnamic acid |
| Synthesis Example 2-1 | InP/ZnSe/Zns | Green | Oleic acid |
| Synthesis Example 2-2 | | | Halide (Cl) |
| Synthesis Example 2-3 | | | 4-methoxycinnamic acid |
| Synthesis Example 3-1 | ZnT eSe/ ZnSe/Zns | Blue | Oleic acid |
| Synthesis Example 3-2 | | | Halide (Cl) 1.0 |
| Synthesis Example 3-3 | | | Halide (Cl) 2.0 |
| Synthesis Example 3-4 | | | 4-methoxycinnamic acid |
| Synthesis Example 3-5 | | | 4-(dimethylamino) cinnamic acid |

Evaluation Example 1

Figure 5A:
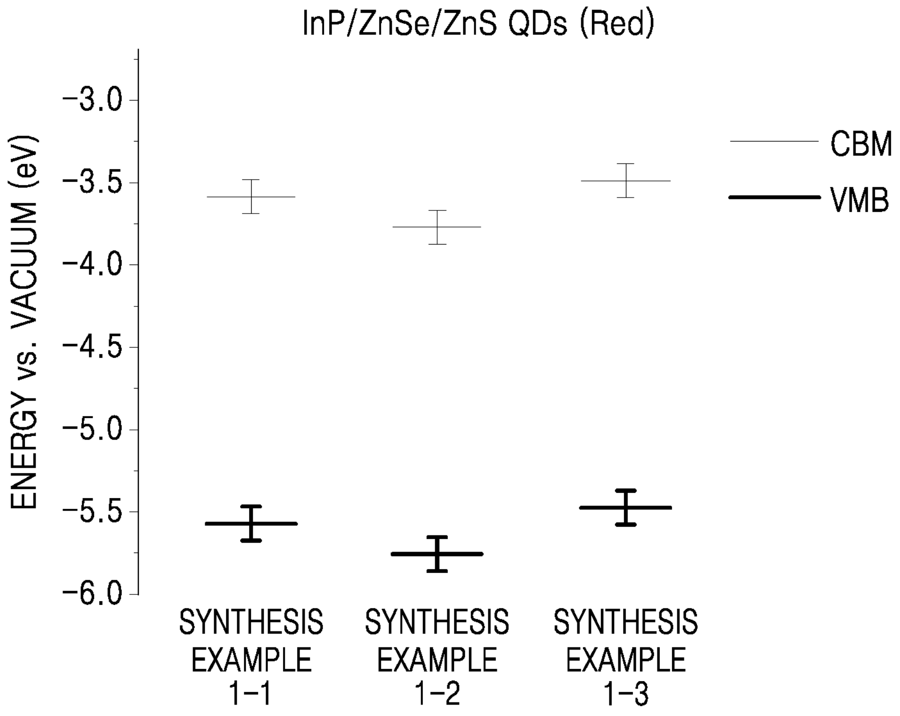
FIG. 5A is graph of energy as measured versus vacuum (in electron Volts (eV)) and shows conduction band minimum (CBM) energy levels and valence band maximum (VBM) energy levels of quantum dots according to Synthesis Examples 1-1 to 1-3.
Figure 5B:
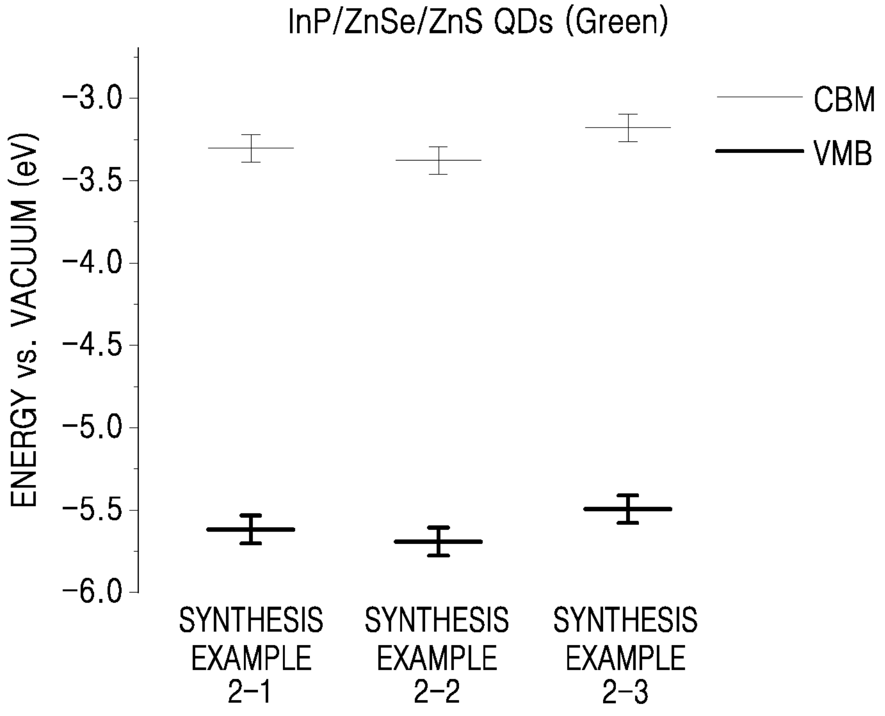
FIG. 5B is graph of energy as measured versus vacuum (eV) and shows CBM energy levels and VBM energy levels of quantum dots according to Synthesis Examples 2-1 to 2-3.
Figure 5C:
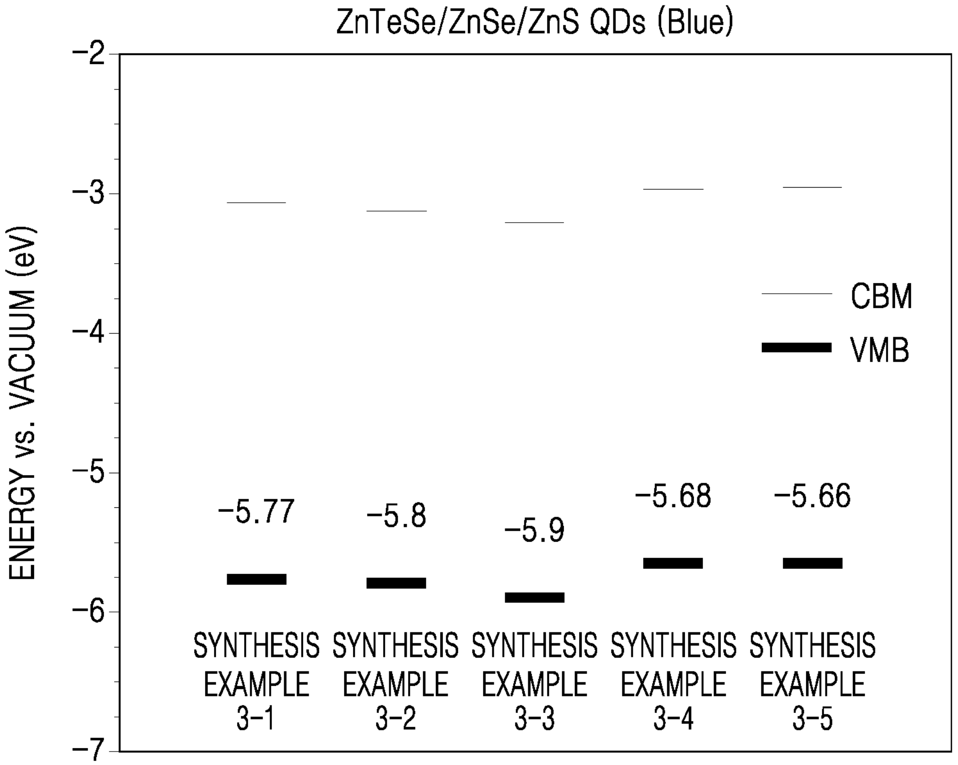
FIG. 5C is graph of energy as measured versus vacuum (eV) and shows CBM energy levels and VBM energy levels of quantum dots according to Synthesis Examples 3-1 to 3-5.

The conduction band minimum (CBM) energy level and the VBM energy level of each of the quantum dots according to Synthesis Examples 1-1 to 1-3, 2-1 to 2-3, and 3-1 to 3-5 were measured, and the results are shown in FIGS. 5A to 5C.

The VBM energy level was measured by ambient photoelectron spectroscopy (APS) measurement, and the energy band gap was measured by UV-Vis spectroscopy measurement. The CBM energy level was calculated from the measured energy band gap and VBM energy level. Measurements were made after forming a film by spin coating (2,500 rpm, 30 sec.) a solution having a concentration of 50 mg/mL on an Au substrate under a nitrogen stream.

Referring to FIGS. 5A to 5C, it was confirmed that the quantum dots had the same energy band gap, but different CBM energy levels and VBM energy levels from one another, according to the type and content of the ligand coordinated to the surface of each quantum dot.

Example 1

On an ITO substrate with patterns formed thereon, a hole injection layer (poly(3,4-ethylenedioxythiophene):poly(styrenesulfonate) (PEDOT:PSS)), a hole transport layer (poly [(9,9-dioctylfluorenyl-2,7-diyl)-co-(4,4'-(N-(4-sec-butylphenyl)diphenylamine)] (TFB)), a quantum dot emission layer, an electron transport layer (ZnMgO), and a cathode (Al) were sequentially stacked in this stated order, thereby manufacturing a light-emitting device. In forming the quantum dot emission layer, the quantum dot according to Synthesis Example 3-1 and the quantum dot according to Synthesis Examples 3-4 were used.

The hole injection layer, the hole transport layer, the quantum dot emission layer, and the electron transport layer were each manufactured using spin coating, and the cathode was manufactured by deposition. The hole injection layer was manufactured to a thickness of 1,400 Å, the hole transport layer was manufactured to a thickness of 400 Å, the quantum dot emission layer was manufactured to a thickness of 200 Å, and the electron transport layer was manufactured to a thickness of 500 Å.

In the case of the hole injection layer and the hole transport layer, after forming a thin film, a VCD process was performed thereon at $10^{-3}$ torr, and a baking process was performed thereon at 230° C. for 30 minutes. In the case of the quantum dot emission layer and the electron transport layer, after forming a thin film, a VCD process was performed thereon at $10^{-3}$ torr, and a baking process was performed thereon at 100° C. for 10 minutes.

Example 2 and Comparative Examples 1 and 2

Light-emitting devices were manufactured in a similar manner as in Example 1, except that, in forming an emission layer, corresponding quantum dots shown in Table 2 were used instead of the quantum dot according to Synthesis Example 3-1 and the quantum dot according to Synthesis Example 3-4, respectively.

TABLE 2

| | Quantum dot used in forming emission layer | |
|---|---|---|
| Example 1 | Synthesis Example 3-1 | Synthesis Example 3-4 |
| Example 2 | Synthesis Example 2-1 | Synthesis Example 2-2 |
| Comparative Example 1 | Synthesis Example 3-1 | — |
| Comparative Example 2 | Synthesis Example 2-1 | — |

Evaluation Example 2

The luminescence efficiency and lifespan of each of the quantum dot light-emitting devices according to Examples 1 and 2 and Comparative Examples 1 and 2 were measured, and the results are shown in FIGS. 6A, 6B, 7A, and 7B. In the case of the efficiency and luminance, power was supplied from a current-voltmeter (Keithley SMU 236), and measurements were made using a luminance meter PR650.

Figure 6A:
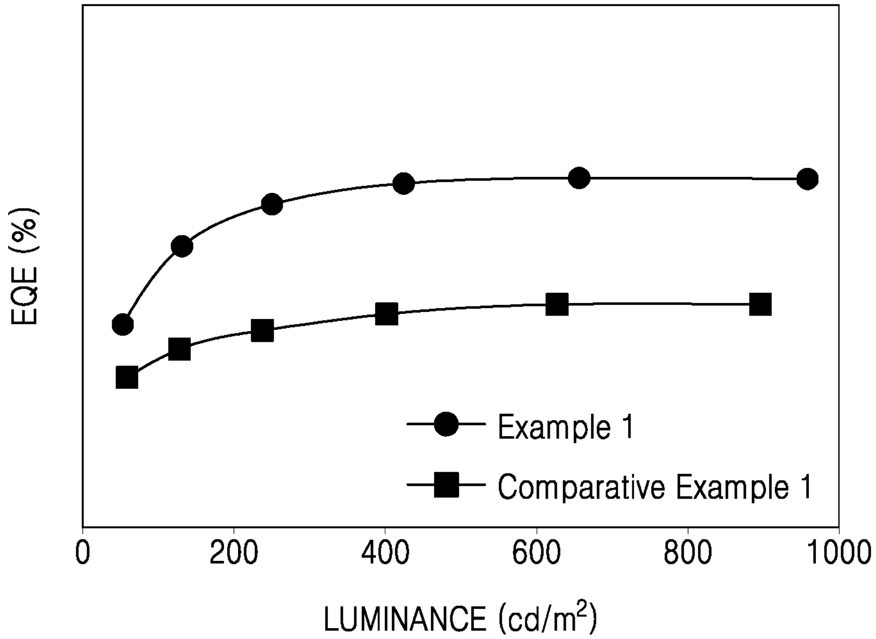
FIG. 6A is a graph of external quantum efficiency (EQE, %) versus luminance (candela per square meter, cd/$m^2$) and shows luminescence efficiency according to luminance of light-emitting devices according to Example 1 and Comparative Example 1.
Figure 6B:
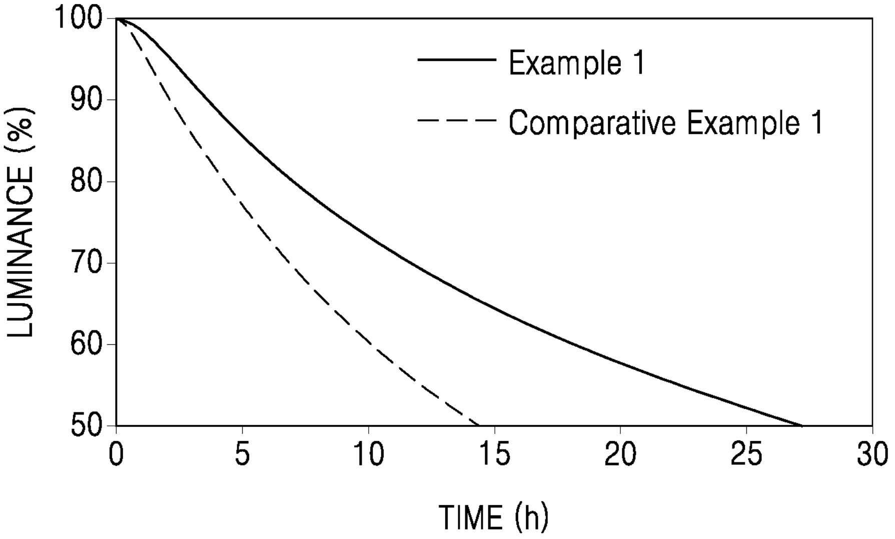
FIG. 6B is a graph of luminance (relative %) versus time (hours, h) and shows lifespan of the light-emitting devices according to Example 1 and Comparative Example 1.

Referring to FIGS. 6A and 6B, it was confirmed that the light-emitting device according to Example 1 had excellent luminescence efficiency and lifespan compared to the light-emitting device according to Comparative Example 1.

Figure 7A:
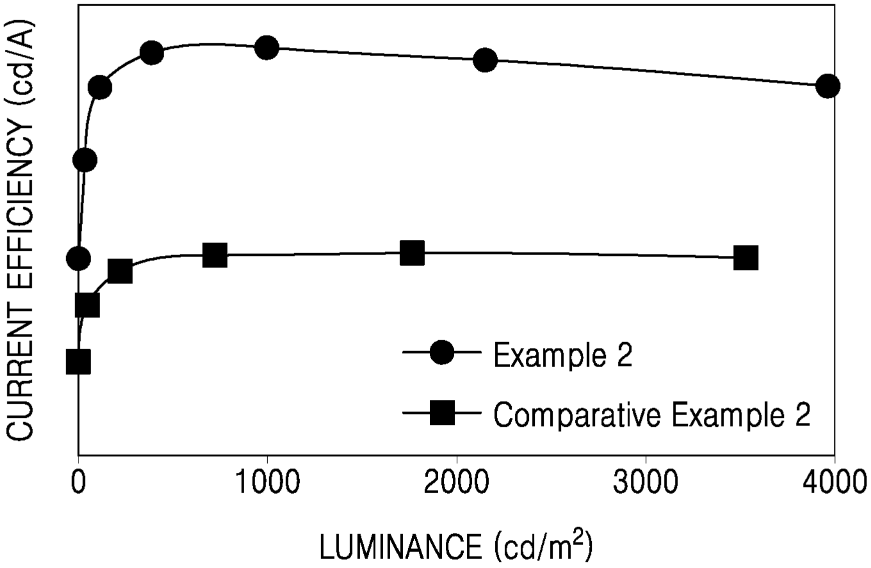
FIG. 7A is a graph of current efficiency (candela per Ampere, cd/A) versus luminance (cd/$m^2$) and shows luminescence efficiency according to luminance of light-emitting devices according to Example 2 and Comparative Example 2.
Figure 7B:
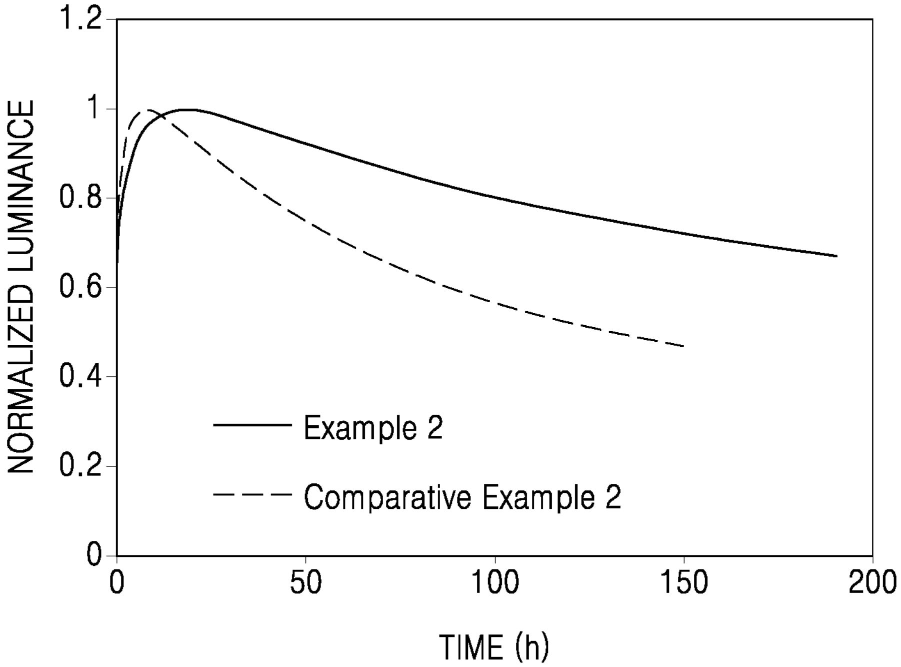
FIG. 7B is a graph of normalized luminance (arbitrary units, a.u.) versus time (h) and shows lifespan of the light-emitting devices according to Example 2 and Comparative Example 2.

Referring to FIGS. 7A and 7B, it was confirmed that the light-emitting device according to Example 2 had excellent luminescence efficiency and lifespan compared to the light-emitting device according to Comparative Example 2.

According to the one or more exemplary embodiments, a light-emitting device may have improved luminescence efficiency and lifespan by using a quantum dot composition including two or more quantum dots that have different energy band positions from each other while having an identical energy band gap.

It should be understood that exemplary embodiments described herein should be considered in a descriptive sense and not for purposes of limitation. Descriptions of features or aspects within each exemplary embodiment should typically be considered as available for other similar features or aspects in other exemplary embodiments. While one or more exemplary embodiments have been described in detail and with reference to the figures, it will be understood by those of ordinary skill in the art that various changes in form and details may be made therein without departing from the spirit and scope as defined by the following claims.

What is claimed is:

1. A quantum dot composition, comprising:

a first quantum dot; and a second quantum dot, wherein a valence band maximum energy level of the first quantum dot is different from a valence band maximum energy level of the second quantum dot, and an energy band gap of the first quantum dot is identical to an energy band gap of the second quantum dot.

2. The quantum dot composition of claim 1, wherein the valence band maximum energy level of the first quantum dot is in a range of about −6.5 electron volts to about −5 electron volts, wherein the valence band maximum energy level is determined by ambient photoelectron spectroscopy.

3. The quantum dot composition of claim 1, wherein the valence band maximum energy level of the second quantum dot is in a range of about −6.6 electron volts to about −5.2 electron volts, wherein the valence band maximum energy level is determined by ambient photoelectron spectroscopy.

4. The quantum dot composition of claim 1, wherein a difference between the valence band maximum energy level of the first quantum dot and the valence band maximum energy level of the second quantum dot is in a range of about 0.01 electron volts to about 1 electron volts, wherein the valence band maximum energy level is determined by ambient photoelectron spectroscopy.

5. The quantum dot composition of claim 1, wherein the first quantum dot comprises a core and a shell covering a portion of the core of the first quantum dot, the second quantum dot comprises a core and a shell covering a portion of the core of the second quantum dot, and an average particle size (D50) of the core of the first quantum dot is different from an average particle size (D50) of the core of the second quantum dot.

6. The quantum dot composition of claim 5, wherein the core of the first quantum dot and the core of the second quantum dot each comprises InGaP, an amount of Ga in the core of the first quantum dot is greater than an amount of Ga in the core of the second quantum dot, and the average particle size (D50) of the core of the first quantum dot is greater than the average particle size (D50) of the core of the second quantum dot.

7. The quantum dot composition of claim 5, wherein the core of the first quantum dot and the core of the second quantum dot each comprises ZnSeTe, an amount of Te in the core of the first quantum dot is greater than an amount of Te in the core of the second quantum dot, and the average particle size (D50) of the core of the first quantum dot is less than the average particle size (D50) of the core of the second quantum dot.

8. The quantum dot composition of claim 5, wherein the shell covering the portion of the core of the first quantum dot comprises two or more layers; and optionally the shell covering the portion of the core of the second quantum dot comprises two or more layers.

9. The quantum dot composition of claim 1, wherein the first quantum dot comprises a first nanomaterial and a first ligand disposed on a surface of the first nanomaterial, the second quantum dot comprises a second nanomaterial and a second ligand disposed on a surface of the second nanomaterial, and the first ligand and the second ligand each independently comprise a halide, a thiol-containing compound, a carboxylic acid-containing compound, or a combination thereof.

10. The quantum dot composition of claim 9, wherein the first nanomaterial and the second nanomaterial are identical to each other.

11. The quantum dot composition of claim 9, wherein the first ligand and the second ligand are identical to each other, and an amount of the first ligand in the first quantum dot is different from an amount of the second ligand in the second quantum dot.

12. The quantum dot composition of claim 9, wherein the first ligand and the second ligand are different from each other.

13. The quantum dot composition of claim 9, wherein the thiol-containing compound comprises a $C_1$-$C_{60}$ alkyl group unsubstituted or substituted with at least one $R_{10a}$, a $C_6$-$C_{60}$ aryl group unsubstituted or substituted with at least one $R_{10a}$, or a combination thereof, the carboxylic acid-containing compound comprises a $C_1$-$C_{60}$ alkyl group unsubstituted or substituted with at least one $R_{10a}$, a $C_1$-$C_{60}$ alkyl group unsubstituted or substituted with at least one $R_{10a}$, a $C_6$-$C_{60}$ aryl group unsubstituted or substituted with at least one $R_{10a}$, —$N(Q_1)(Q_2)$, or a combination thereof, $R_{10a}$ is:

deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{60}$ carbocyclic group, a $C_1$-$C_{60}$ heterocyclic group, a $C_7$-$C_{60}$ aryl alkyl group, a $C_6$-$C_{60}$ aryloxy group, a $C_6$-$C_{60}$ arylthio group, a $C_2$-$C_{60}$ heteroaryl alkyl group, a $C_1$-$C_{60}$ heteroaryloxy group, a $C_1$-$C_{60}$ heteroarylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(Q_{11})(Q_{12})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_7$-$C_{60}$ aryl alkyl group, a $C_6$-$C_{60}$ aryloxy group, a $C_6$-$C_{60}$ arylthio group, a $C_2$-$C_{60}$ heteroaryl alkyl group, a $C_1$-$C_{60}$ heteroaryloxy group, a $C_1$-$C_{60}$ heteroarylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(Q_{21})(Q_{22})$, —$P(=O)(Q_{21})(Q_{22})$, or a combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(Q_{31})(Q_{32})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{60}$ carbocyclic group, a substituted or unsubstituted $C_1$-$C_{60}$ heterocyclic group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group.

14. The quantum dot composition of claim 1, wherein a weight ratio of the first quantum dot to the second quantum dot is in a range of about 1:10 to about 10:1.

15. A light-emitting device, comprising:

a first electrode;

a second electrode facing the first electrode; and an interlayer located between the first electrode and the second electrode, wherein the interlayer comprises an emission layer, and wherein the emission layer comprises the quantum dot composition of claim 1.

16. The light-emitting device of claim 15, wherein the first electrode is an anode, the second electrode is a cathode, the interlayer further comprises a hole transport region located between the first electrode and the emission layer, and an electron transport region located between the emission layer and the second electrode, the hole transport region comprises a hole injection layer, a hole transport layer, an emission auxiliary layer, an electron blocking layer, or a combination thereof, and the electron transport region comprises a hole blocking layer, an electron transport layer, an electron injection layer, or a combination thereof.

17. The light-emitting device of claim 16, wherein the electron transport region comprises an electron transport layer, and the electron transport layer comprises a metal oxide represented by Formula 1:

$$M_pO_q \qquad \text{Formula 1}$$

wherein, in Formula 1,

M is Zn, Ti, Zr, Sn, W, Ta, Ni, Mo, Cu, V, or a combination thereof, and p and q are each independently an integer from 1 to 5.

18. An electronic apparatus, comprising the light-emitting device of claim 15.

19. The electronic apparatus of claim 18, further comprising a thin-film transistor, wherein the thin-film transistor comprises a source electrode and a drain electrode, and the first electrode of the light-emitting device is electrically connected to at least one of the source electrode and the drain electrode of the thin-film transistor.

20. The electronic apparatus of claim 18, further comprising a color filter, a color conversion layer, a touch screen layer, a polarizing layer, or a combination thereof.

* * * * *